(12) United States Patent
Obu et al.

(10) Patent No.: US 11,626,511 B2
(45) Date of Patent: Apr. 11, 2023

(54) SEMICONDUCTOR DEVICE

(71) Applicant: Murata Manufacturing Co., Ltd., Kyoto-fu (JP)

(72) Inventors: Isao Obu, Nagaokakyo (JP); Yasunari Umemoto, Nagaokakyo (JP); Masahiro Shibata, Nagaokakyo (JP); Shigeki Koya, Nagaokakyo (JP); Masao Kondo, Nagaokakyo (JP); Takayuki Tsutsui, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/207,084

(22) Filed: Nov. 30, 2018

(65) Prior Publication Data
US 2019/0172933 A1 Jun. 6, 2019

(30) Foreign Application Priority Data
Dec. 1, 2017 (JP) .............................. JP2017-231786

(51) Int. Cl.
*H01L 29/737* (2006.01)
*H01L 29/08* (2006.01)
(Continued)

(52) U.S. Cl.
CPC ...... *H01L 29/7371* (2013.01); *H01L 21/0262* (2013.01); *H01L 21/02538* (2013.01);
(Continued)

(58) Field of Classification Search
CPC ............. H01L 21/0538; H01L 21/0262; H01L 21/28575; H01L 21/30612;
(Continued)

(56) References Cited

U.S. PATENT DOCUMENTS 5,789,301 A * 8/1998 Hill .................. H01L 29/66318
438/320
7,998,807 B2 8/2011 Feng et al.
(Continued)

FOREIGN PATENT DOCUMENTS

CN 104900688 A 9/2015
JP H06-338515 A 12/1994
(Continued)

OTHER PUBLICATIONS

An Office Action mailed by China National Intellectual Property Administration dated Sep. 3, 2021 which corresponds to Chinese Patent Application No. 201811453223.8 and is related to U.S. Appl. No. 16/207,084 with English language translation.

*Primary Examiner* — Alia Sabur
(74) *Attorney, Agent, or Firm* — Studebaker & Brackett PC

(57) ABSTRACT

A bipolar transistor including a first collector layer, a second collector layer, a base layer, and an emitter layer is disposed on a substrate. Etching characteristics of the second collector layer are different from etching characteristics of the first collector layer and the base layer. In plan view, an edge of an interface between the first collector layer and the second collector layer is disposed inside an edge of a lower surface of the base layer, and an edge of an upper surface of the second collector layer coincides with the edge of the lower surface of the base layer or is disposed inside the edge of the lower surface of the base layer.

20 Claims, 13 Drawing Sheets

(51) Int. Cl.
| | |
|---|---|
| *H01L 29/10* | (2006.01) |
| *H01L 29/205* | (2006.01) |
| *H01L 21/02* | (2006.01) |
| *H01L 21/285* | (2006.01) |
| *H01L 21/308* | (2006.01) |
| *H01L 21/306* | (2006.01) |
| *H01L 29/66* | (2006.01) |
| *H01L 23/00* | (2006.01) |

(52) U.S. Cl.
CPC ...... *H01L 21/28575* (2013.01); *H01L 21/308* (2013.01); *H01L 21/30612* (2013.01); *H01L 21/30617* (2013.01); *H01L 24/13* (2013.01); *H01L 29/0817* (2013.01); *H01L 29/0826* (2013.01); *H01L 29/1004* (2013.01); *H01L 29/205* (2013.01); *H01L 29/66242* (2013.01); *H01L 2224/13025* (2013.01); *H01L 2224/13083* (2013.01); *H01L 2224/13111* (2013.01); *H01L 2224/13139* (2013.01); *H01L 2224/13147* (2013.01); *H01L 2224/13166* (2013.01); *H01L 2924/014* (2013.01)

(58) Field of Classification Search
CPC . H01L 21/30617; H01L 21/308; H01L 24/13; H01L 29/7371; H01L 29/0817; H01L 29/0826; H01L 29/1004; H01L 29/205; H01L 29/0821; H01L 29/66318
See application file for complete search history.

(56) References Cited

U.S. PATENT DOCUMENTS

| | | | | |
|---|---|---|---|---|
| 8,970,126 | B2* | 3/2015 | Feng | H01L 33/02 257/98 |
| 10,553,633 | B2* | 2/2020 | Hsu | H01L 31/1105 |
| 2002/0066909 | A1* | 6/2002 | Tanomura | H01L 29/66318 257/E29.189 |
| 2002/0079511 | A1* | 6/2002 | Tu | H01L 29/7371 257/E29.189 |
| 2002/0190273 | A1* | 12/2002 | Delage | H01L 29/66318 257/E29.189 |
| 2003/0077870 | A1* | 4/2003 | Yoon | H01L 29/7371 438/320 |
| 2003/0218187 | A1 | 11/2003 | Tanomura et al. | |
| 2004/0178475 | A1* | 9/2004 | Harmon | H01L 29/7371 257/E29.189 |
| 2004/0262715 | A1* | 12/2004 | Miura | H01L 29/732 257/E29.183 |
| 2013/0134483 | A1* | 5/2013 | Adkisson | H01L 29/0826 257/E29.174 |
| 2014/0035660 | A1* | 2/2014 | Walter | H01L 33/002 327/534 |
| 2015/0255954 | A1* | 9/2015 | Feng | H01S 5/18369 438/29 |
| 2016/0020579 | A1* | 1/2016 | Feng | H01L 29/0804 372/38.03 |

FOREIGN PATENT DOCUMENTS

| | | |
|---|---|---|
| JP | 2000-156382 A | 6/2000 |
| JP | 2005-101636 A | 4/2005 |
| JP | 2015-023236 A | 2/2015 |

* cited by examiner

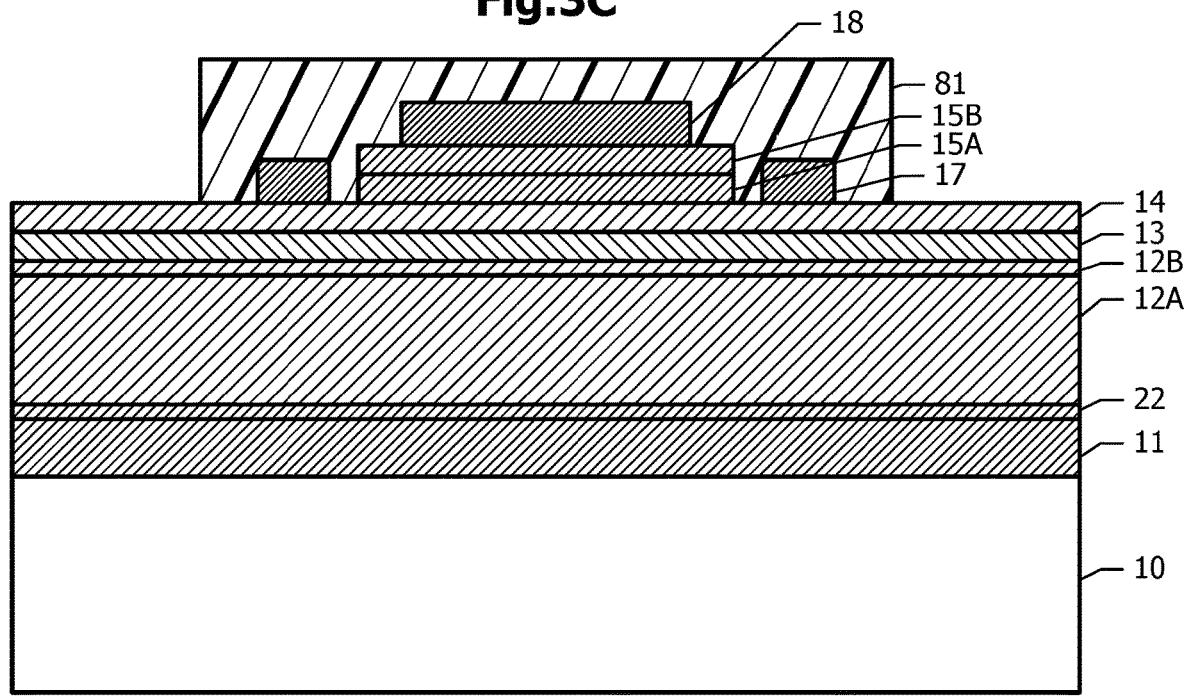
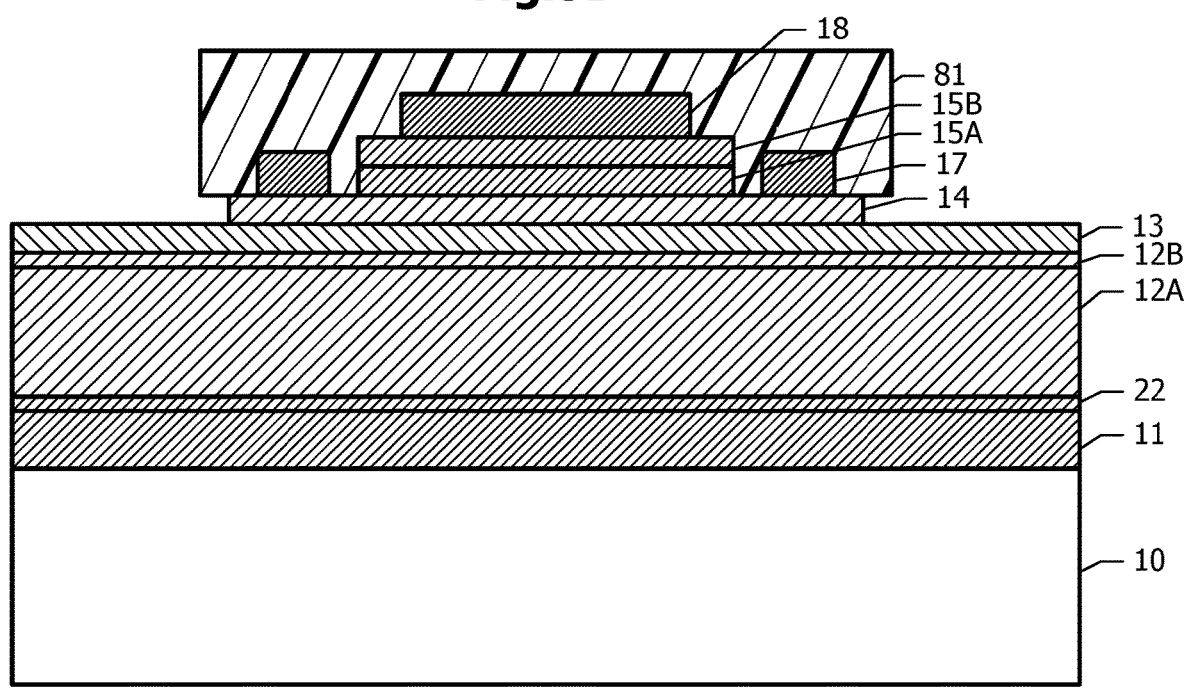

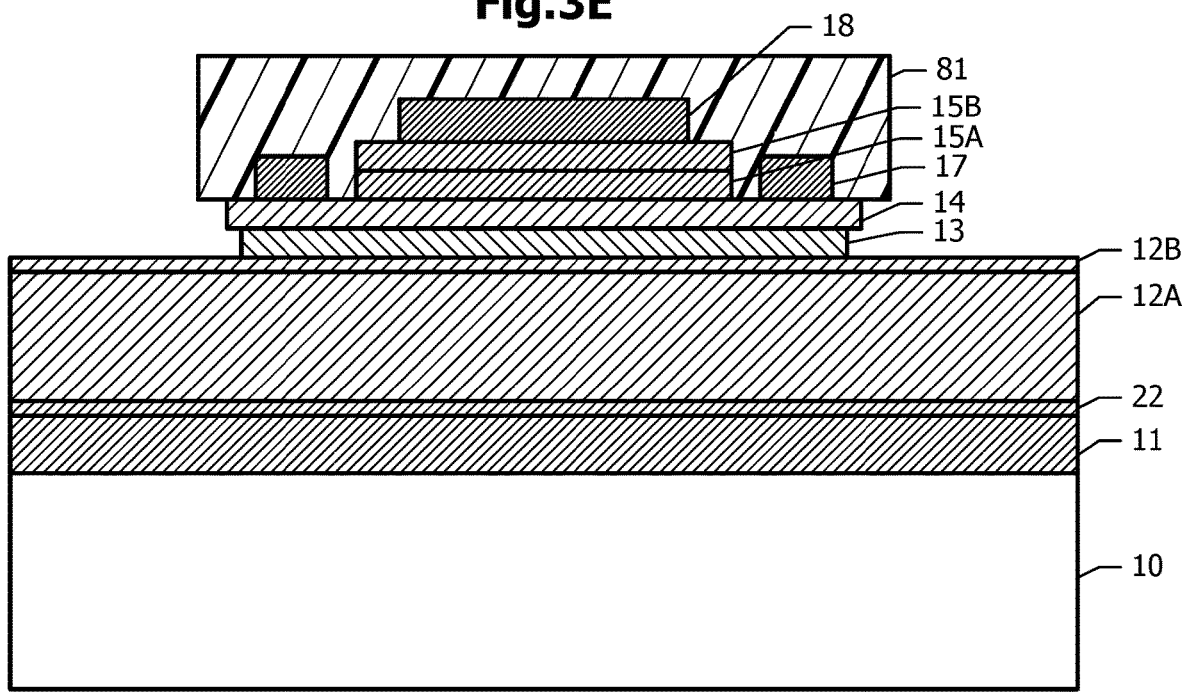
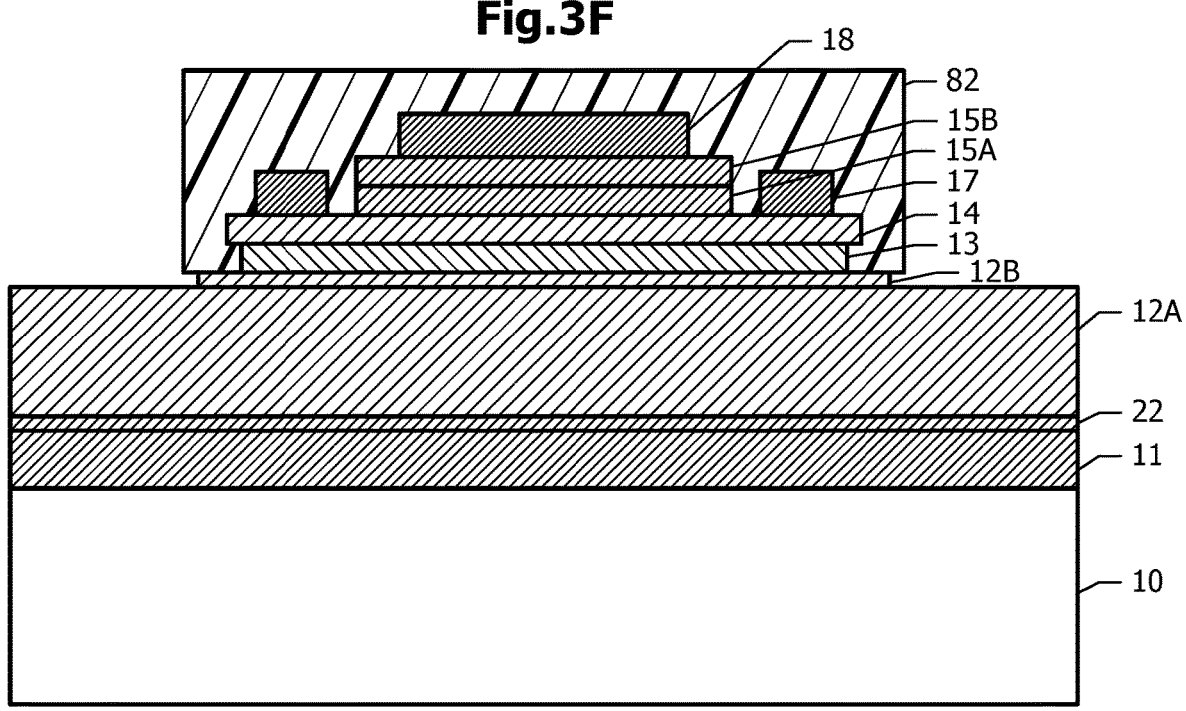

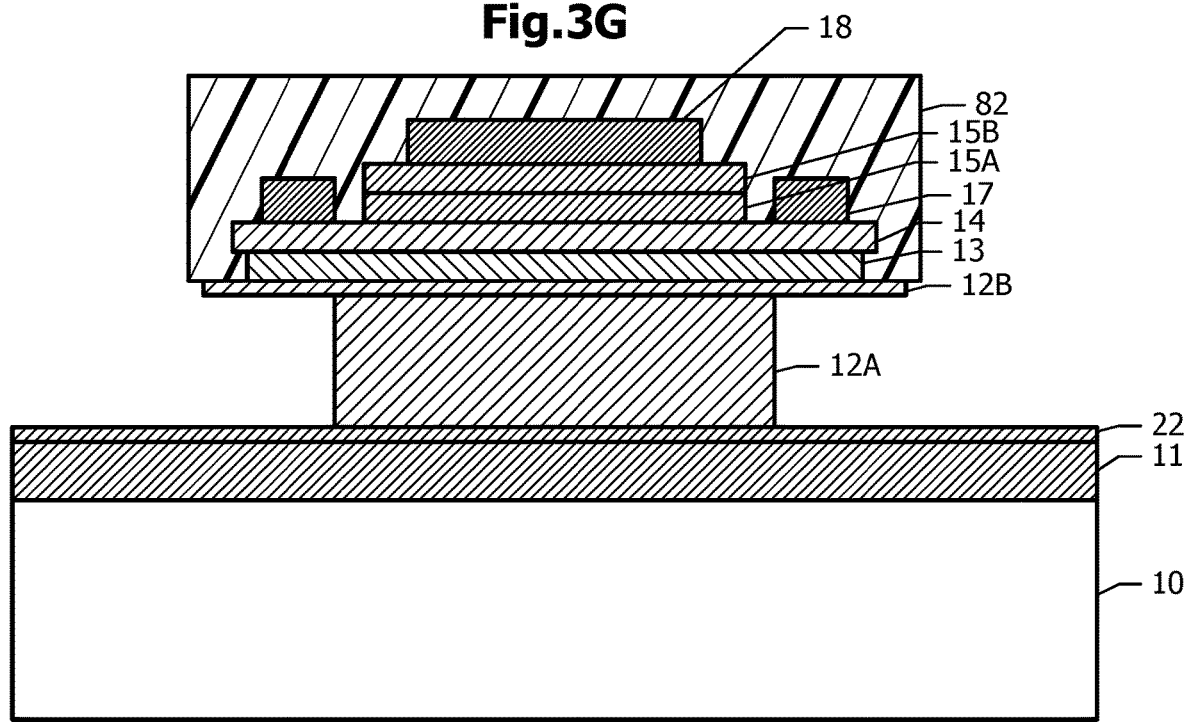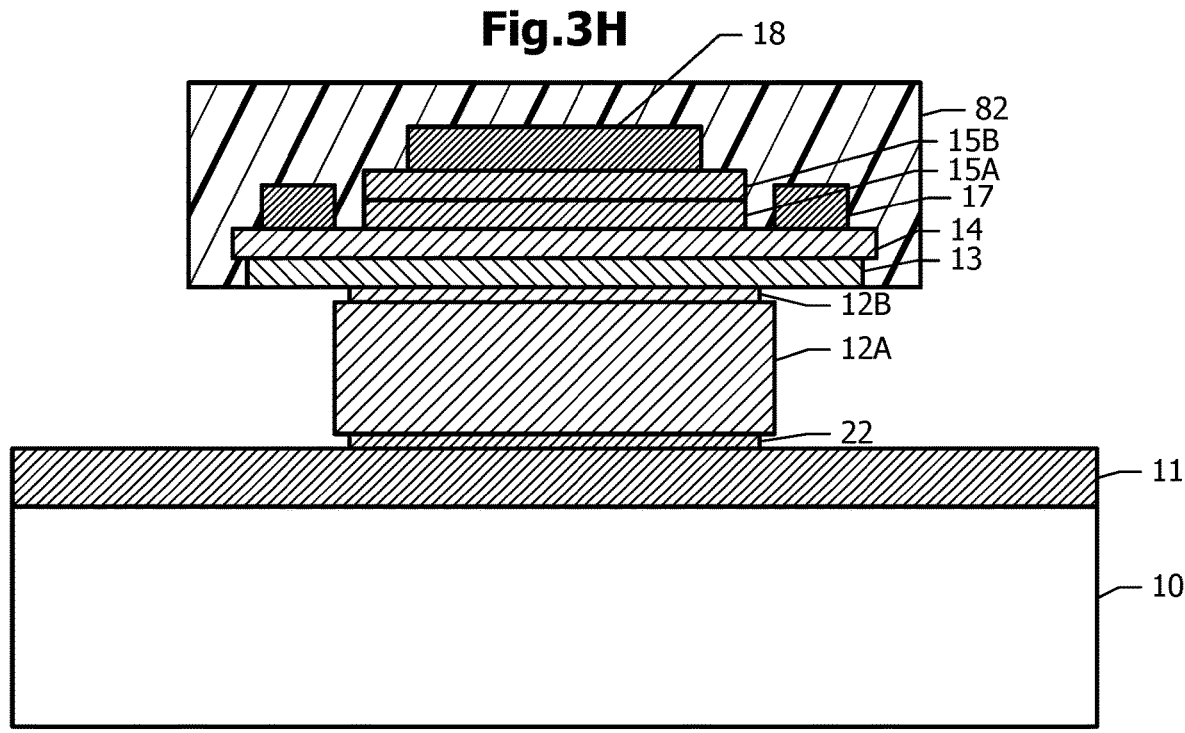

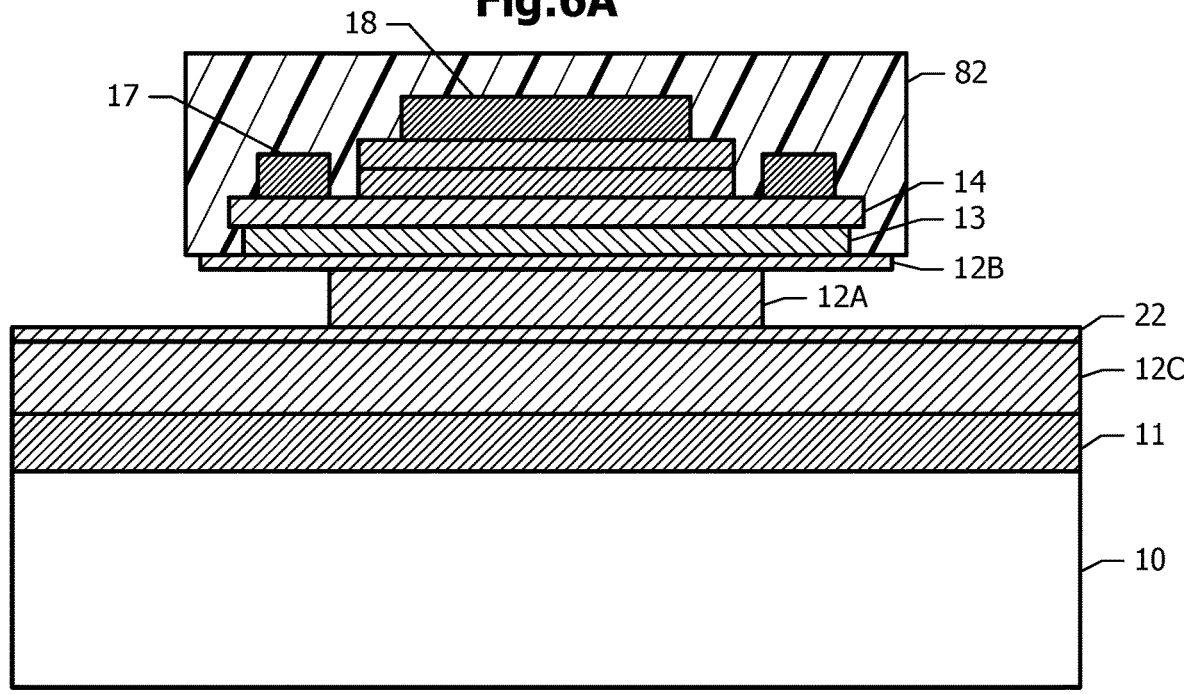
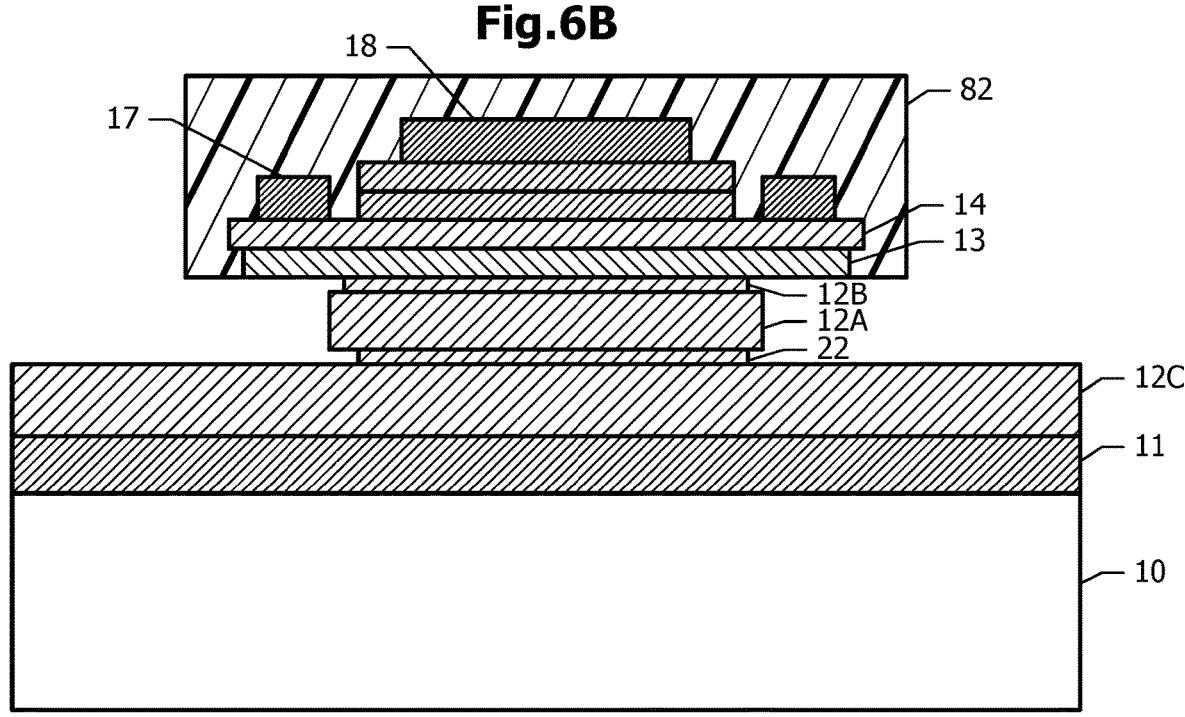

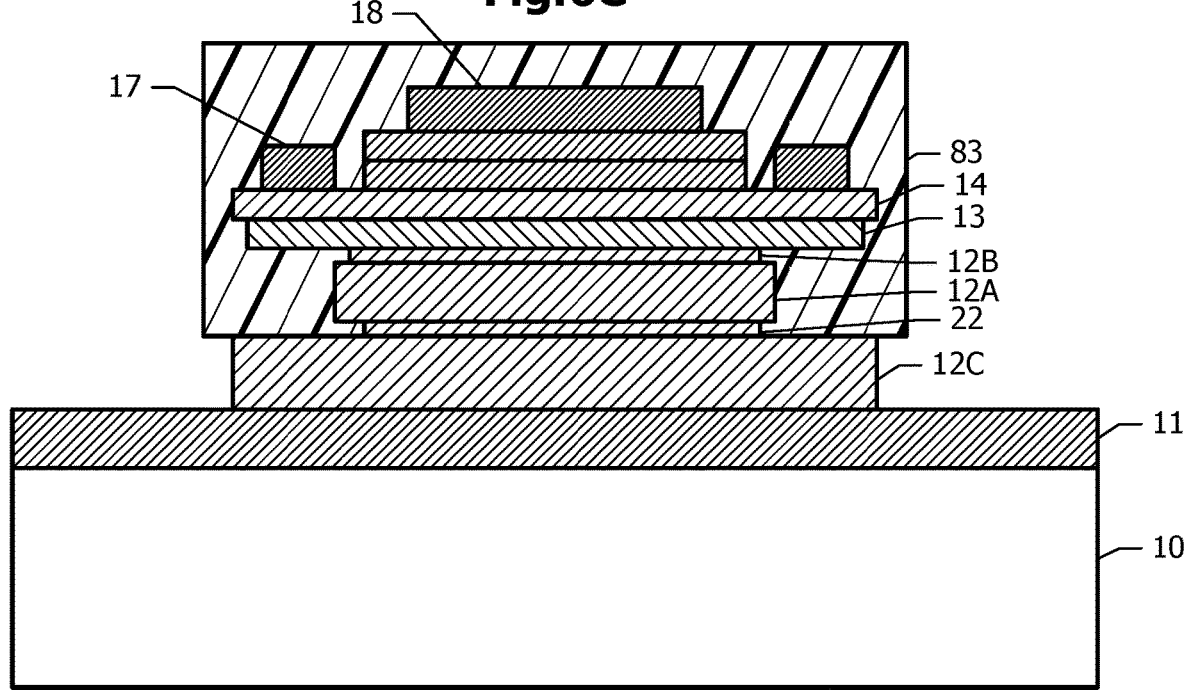
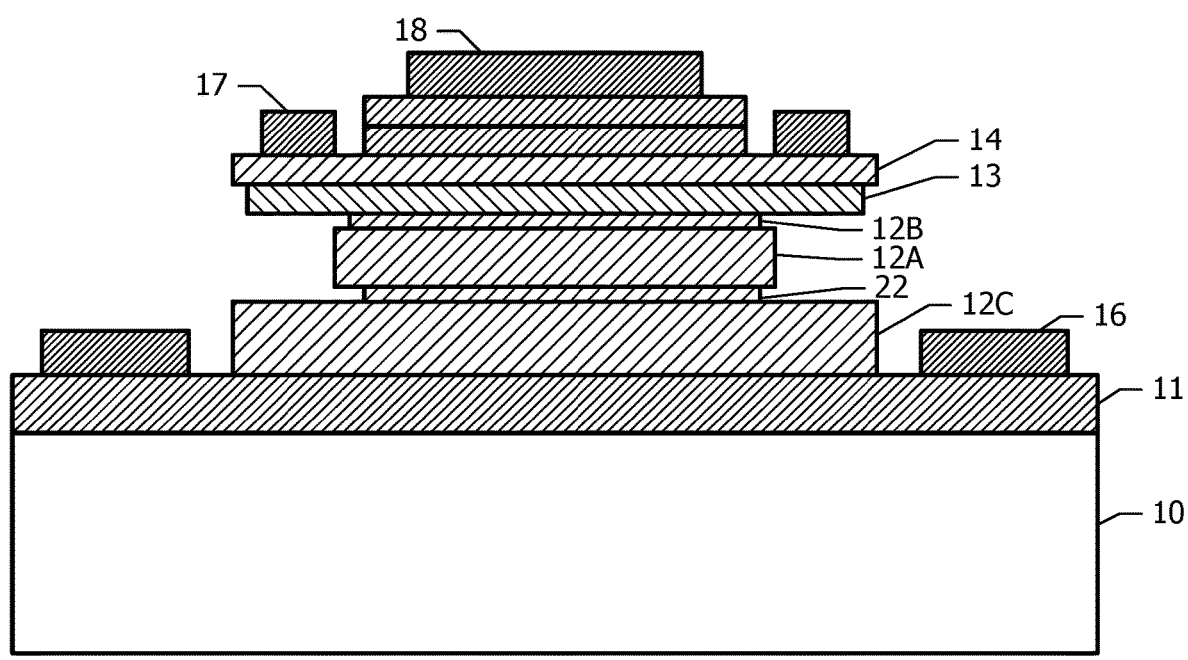

SEMICONDUCTOR DEVICE

CROSS-REFERENCE TO RELATED APPLICATION

This application claims benefit of priority to Japanese Patent Application No. 2017-231786, filed Dec. 1, 2017, the entire content of which is incorporated herein by reference.

BACKGROUND

Technical Field

The present disclosure relates to a semiconductor device.

Background Art

Currently, mobile communication systems typified by cellular phone terminals are to be transferred from the fourth generation (4G) to the fifth generation (5G). In the fifth-generation mobile communication systems, a frequency band higher than that in the fourth-generation mobile communication systems is used. With an increase in the frequency, the power loss in radio-frequency circuits also increases. Therefore, for radio-frequency power amplifiers, which are main components of cellular phone terminals for the fifth-generation mobile communication systems, the demand for the realization of a higher gain has been increasing. In general, heterojunction bipolar transistors (HBTs) are used in the radio-frequency power amplifiers.

For example, Japanese Unexamined Patent Application Publication No. 2000-156382 discloses an HBT in which the base-collector capacitance is reduced in order to improve radio-frequency characteristics. The HBT disclosed in Japanese Unexamined Patent Application Publication No. 2000-156382 includes a collector layer, a base layer, and an emitter layer that are stacked on a substrate. The collector layer has a three-layer structure including a lower layer made of InGaP, an intermediate layer made of GaAs, and an upper layer made of InGaP. A base electrode is disposed on the base layer, and an emitter electrode is disposed on the emitter layer.

A portion of the intermediate layer of the collector layer, the portion being located right under the base electrode, is removed, and an outer peripheral portion of the upper layer projects outward from the edge of the intermediate layer to form an overhanging portion. This upper layer projects outward from the edge of the base layer disposed on the upper layer. The base-collector capacitance is reduced by removing the portion of the intermediate layer of the collector layer, the portion being located right under the base electrode.

SUMMARY

According to consideration by the inventors of the present disclosure, it has been found difficult to secure a sufficient production yield in order to use the HBT disclosed in Japanese Unexamined Patent Application Publication No. 2000-156382 as a device for a radio-frequency power amplifier. Accordingly, the present disclosure provides a semiconductor device whose gain can be increased in the radio-frequency band and in which a decrease in the production yield can be suppressed.

A semiconductor device according to a first aspect of the present disclosure includes a bipolar transistor including a first collector layer, a second collector layer, a base layer, and an emitter layer that are stacked on a substrate. A composition of the first collector layer and a composition of the second collector layer are different from each other. In plan view, an edge of an interface between the first collector layer and the second collector layer is disposed inside an edge of a lower surface of the base layer, and an edge of an upper surface of the second collector layer coincides with the edge of the lower surface of the base layer or is disposed inside the edge of the lower surface of the base layer.

Since the edge of the interface between the first collector layer and the second collector layer is disposed inside the edge of the lower surface of the base layer, the base-collector capacitance can be reduced. Since the edge of the upper surface of the second collector layer does not project outward from the edge of the lower surface of the base layer, the second collector layer can be supported with sufficient mechanical strength. As a result, it is possible to suppress a decrease in the production yield due to insufficient mechanical strength of the second collector layer.

A semiconductor device according to a second aspect of the present disclosure has the configuration of the semiconductor device according to the first aspect, wherein the second collector layer has a composition containing phosphorus. By utilizing the difference in etching characteristics between the first collector layer and the second collector layer, an unnecessary portion of the first collector layer can be removed by etching.

A semiconductor device according to a third aspect of the present disclosure has the configuration of the semiconductor device according to the first or second aspect, wherein, in plan view, an edge of an upper surface of the first collector layer, the edge of the upper surface of the second collector layer, and an edge of a lower surface of the second collector layer are disposed inside the edge of the lower surface of the base layer, and the edge of the lower surface of the second collector layer is disposed inside the edge of the upper surface of the first collector layer. The configuration is obtained by removing an unnecessary portion of the second collector layer by etching utilizing the difference in etching characteristics between the first collector layer and the second collector layer.

A semiconductor device according to a fourth aspect of the present disclosure has the configuration of the semiconductor device according to any one of the first to third aspects, wherein, in plan view, an edge of an upper surface of the base layer is disposed inside an edge of a lower surface of the emitter layer.

In the case where etching characteristics of the emitter layer and etching characteristics of the base layer are different from each other, the configuration described above is obtained by removing an unnecessary portion of the emitter layer and an unnecessary portion of the base layer by etching using the same etching mask.

A semiconductor device according to a fifth aspect of the present disclosure has the configuration of the semiconductor device according to any one of the first to fourth aspects and further includes a sub-collector layer disposed between the substrate and the first collector layer and functioning as a current path through which a collector current flows into the first collector layer, and an etching stopper layer disposed between the sub-collector layer and the first collector layer and made of a semiconductor having the same etching characteristics as the second collector layer. In plan view, an edge of an upper surface of the etching stopper layer is disposed inside an edge of a lower surface of the first collector layer.

When an unnecessary portion of the first collector layer is removed by etching, the etching in a depth direction can be stopped by the etching stopper layer. This enables the degree of freedom of the amount of side etching of the first collector layer to be increased. A semiconductor device according to a sixth aspect of the present disclosure has the configuration of the semiconductor device according to the fifth aspect. The base layer contains one compound semiconductor selected from the group consisting of GaAs, AlGaAs, InGaAs, GaAsSb, GaAsBi, and GaInNAs as a main component, and the emitter layer contains InGaP as a main component. A heterojunction is formed at the interface between the base layer and the emitter layer to provide a heterojunction bipolar transistor having good radio-frequency characteristics.

A semiconductor device according to a seventh aspect of the present disclosure has the configuration of the semiconductor device according to the sixth aspect, wherein the first collector layer and the sub-collector layer contain GaAs as a main component, and the second collector layer and the etching stopper layer contain InGaP as a main component.

It is possible to find conditions for selectively etching the first collector layer and the sub-collector layer with respect to the second collector layer and the etching stopper layer. Conversely, it is possible to find conditions for selectively etching the second collector layer and the etching stopper layer with respect to the first collector layer and the sub-collector layer.

A semiconductor device according to an eighth aspect of the present disclosure has the configuration of the semiconductor device according to the sixth aspect, wherein the first collector layer and the sub-collector layer contain GaAs as a main component, the second collector layer contains InGaPN as a main component, and the etching stopper layer contains InGaP as a main component. It is possible to prevent a potential barrier to an electron from being generated at the interface between the base layer and the second collector layer.

A semiconductor device according to a ninth aspect of the present disclosure has the configuration of the semiconductor device according to the sixth aspect, wherein the first collector layer and the sub-collector layer contain GaAs as a main component, and the second collector layer and the etching stopper layer contain InGaPN as a main component. It is possible to prevent discontinuity of the energy level at the lower edge of the conduction band from being generated at the interface between the first collector layer and the etching stopper layer.

A semiconductor device according to a tenth aspect of the present disclosure has the configuration of the semiconductor device according to any one of the first to ninth aspects and further includes a bump disposed at a position higher than the emitter layer as viewed from the substrate and connected to the emitter layer in terms of a direct current. The semiconductor device can be face-down mounted on a mounting substrate using the bump.

A semiconductor device according to an eleventh aspect of the present disclosure has the configuration of the semiconductor device according to the fifth aspect and further includes a third collector layer disposed between the sub-collector layer and the etching stopper layer and having the same etching characteristics as the first collector layer. In plan view, an edge of an upper surface of the third collector layer is disposed outside the edge of the lower surface of the first collector layer.

A thickness suitable for a collector layer is secured by the first collector layer and the third collector layer, and the thickness of the first collector layer can be thereby reduced. Accordingly, controllability can be enhanced when the first collector layer is subjected to side etching.

A semiconductor device according to a twelfth aspect of the present disclosure has the configuration of the semiconductor device according to the eleventh aspect, wherein the base layer contains one compound semiconductor selected from the group consisting of GaAs, AlGaAs, InGaAs, GaAsSb, GaAsBi, and GaInNAs as a main component, the emitter layer contains InGaP as a main component, the first collector layer, the third collector layer, and the sub-collector layer contain GaAs as a main component, and the second collector layer and the etching stopper layer contain InGaP as a main component.

A heterojunction is formed at the interface between the base layer and the emitter layer to provide a heterojunction bipolar transistor having good radio-frequency characteristics. It is possible to find conditions for selectively etching the first collector layer, the third collector layer, and the sub-collector layer with respect to the second collector layer and the etching stopper layer. Conversely, it is possible to find conditions for selectively etching the second collector layer and the etching stopper layer with respect to the first collector layer, the third collector layer, and the sub-collector layer.

A semiconductor device according to a thirteenth aspect of the present disclosure has the configuration of the semiconductor device according to the eleventh aspect, wherein the base layer contains one compound semiconductor selected from the group consisting of GaAs, AlGaAs, InGaAs, GaAsSb, GaAsBi, and GaInNAs as a main component, the emitter layer contains InGaP as a main component, the first collector layer, the third collector layer, and the sub-collector layer contain GaAs as a main component, the second collector layer contains InGaPN as a main component, and the etching stopper layer contains InGaP as a main component. It is possible to prevent a potential barrier to an electron from being generated at the interface between the base layer and the second collector layer.

A semiconductor device according to a fourteenth aspect of the present disclosure has the configuration of the semiconductor device according to the eleventh aspect, wherein the base layer contains one compound semiconductor selected from the group consisting of GaAs, AlGaAs, InGaAs, GaAsSb, GaAsBi, and GaInNAs as a main component, the emitter layer contains InGaP as a main component, the first collector layer, the third collector layer, and the sub-collector layer contain GaAs as a main component, and the second collector layer and the etching stopper layer contain InGaPN as a main component. It is possible to prevent discontinuity of the energy level at the lower edge of the conduction band from being generated at the interface between the first collector layer and the etching stopper layer.

A semiconductor device according to a fifteenth aspect of the present disclosure has the configuration of the semiconductor device according to any one of the eleventh to fourteenth aspects and further includes a bump disposed at a position higher than the emitter layer as viewed from the substrate and connected to the emitter layer in terms of a direct current. The semiconductor device can be face-down mounted on a mounting substrate using the bump.

Since the edge of the interface between the first collector layer and the second collector layer is disposed inside the edge of the lower surface of the base layer, the base-collector capacitance can be reduced. Since the edge of the upper surface of the second collector layer does not project outward from the edge of the lower surface of the base layer, the second collector layer can be supported with sufficient mechanical strength. As a result, it is possible to suppress a decrease in the production yield due to insufficient mechanical strength of the second collector layer. The unnecessary portion of the first collector layer can be removed by etching utilizing the difference in etching characteristics between the first collector layer and the second collector layer.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIGS. 3C and 3D are sectional views of a semiconductor device according to the second embodiment during its production;

FIGS. 3E and 3F are sectional views of a semiconductor device according to the second embodiment during its production;

FIGS. 3G and 3H are sectional views of a semiconductor device according to the second embodiment during its production;

FIGS. 6A and 6B are sectional views of a semiconductor device according to the fourth embodiment during its production;

FIGS. 6C and 6D are sectional views of a semiconductor device according to the fourth embodiment during its production;

DETAILED DESCRIPTION

As a result of consideration of the HBT in the related art disclosed in Japanese Unexamined Patent Application Publication No. 2000-156382, the inventors of the present disclosure have found that there is a problem in production. Prior to the descriptions of embodiments of the present disclosure, the problem will be described with reference to FIG. 8.

Figure 8:
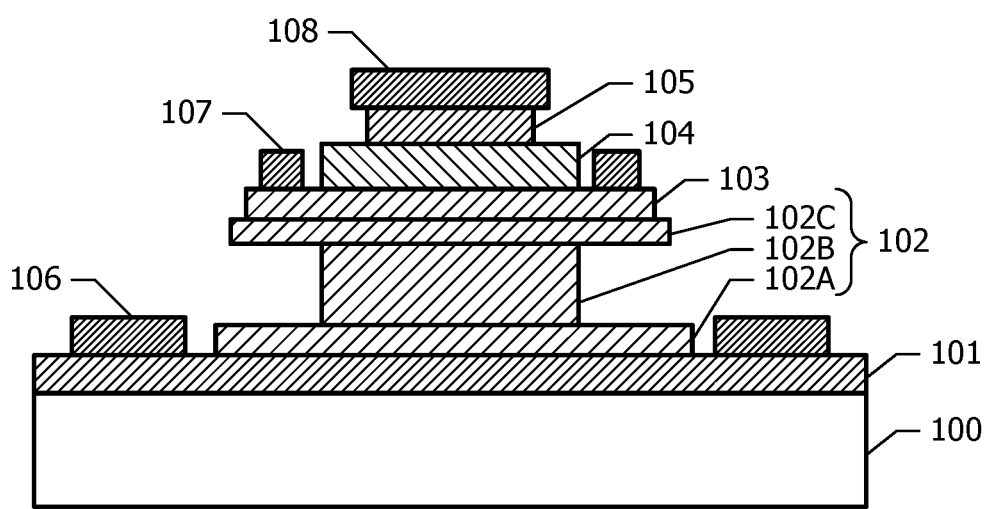
FIG. 8 is a sectional view of an HBT in the related art.

FIG. 8 is a sectional view of an HBT in the related art. A sub-collector layer 101, a collector layer 102, a base layer 103, an emitter layer 104, and an emitter cap layer 105 are stacked on a substrate 100. The collector layer 102 has a three-layer structure including a collector lower layer 102A made of InGaP, a collector intermediate layer 102B made of GaAs, and a collector upper layer 102C made of InGaP.

A collector electrode 106 is disposed on the sub-collector layer 101. A base electrode 107 is disposed on the base layer 103. An emitter electrode 108 is disposed on the emitter layer 104 with the emitter cap layer 105 therebetween. The edge of the collector intermediate layer 102B is disposed behind the edges of the collector lower layer 102A and the collector upper layer 102C. Therefore, the collector upper layer 102C projects outward from the edge of the collector intermediate layer 102B to form an overhanging portion. In addition, the collector upper layer 102C projects outward from the edge of the base layer 103 disposed thereon.

At the interface between the base layer 103 made of GaAs and the collector upper layer 102C made of InGaP, an energy discontinuity of about 200 meV is generated at the lower edge of the conduction band. This discontinuity serves as a potential barrier to an electron that flows from the base layer 103 to the collector upper layer 102C.

In order that an electron flows from the base layer 103 to the collector layer 102, the electron must pass through the collector upper layer 102C due to the tunneling effect. When the collector upper layer 102C has a large thickness, the tunneling effect does not exhibit, and the potential barrier at the interface between the base layer 103 and the collector upper layer 102C blocks the transfer of the electron. As a result, since the collector current decreases, the gain of the HBT decreases. It has been found that the thickness of the collector upper layer 102C is preferably 20 nm or less, and more preferably 10 nm or less so that an electron can pass through the collector upper layer 102C due to the tunneling effect.

When the collector upper layer 102C has a thickness of 20 nm or less, a portion of the collector upper layer 102C projecting outward from the edge of the collector intermediate layer 102B and the edge of the base layer 103 may have insufficient mechanical strength. The risk of detachment of the projecting portion of the collector upper layer 102C increases during a step of the semiconductor process or during an assembly operation of the radio-frequency power amplifier. Thus, the thin projecting portion of the collector upper layer 102C may be the cause of a decrease in the production yield. In embodiments described below, a decrease in the production yield can be suppressed.

First Embodiment

Figure 1A:
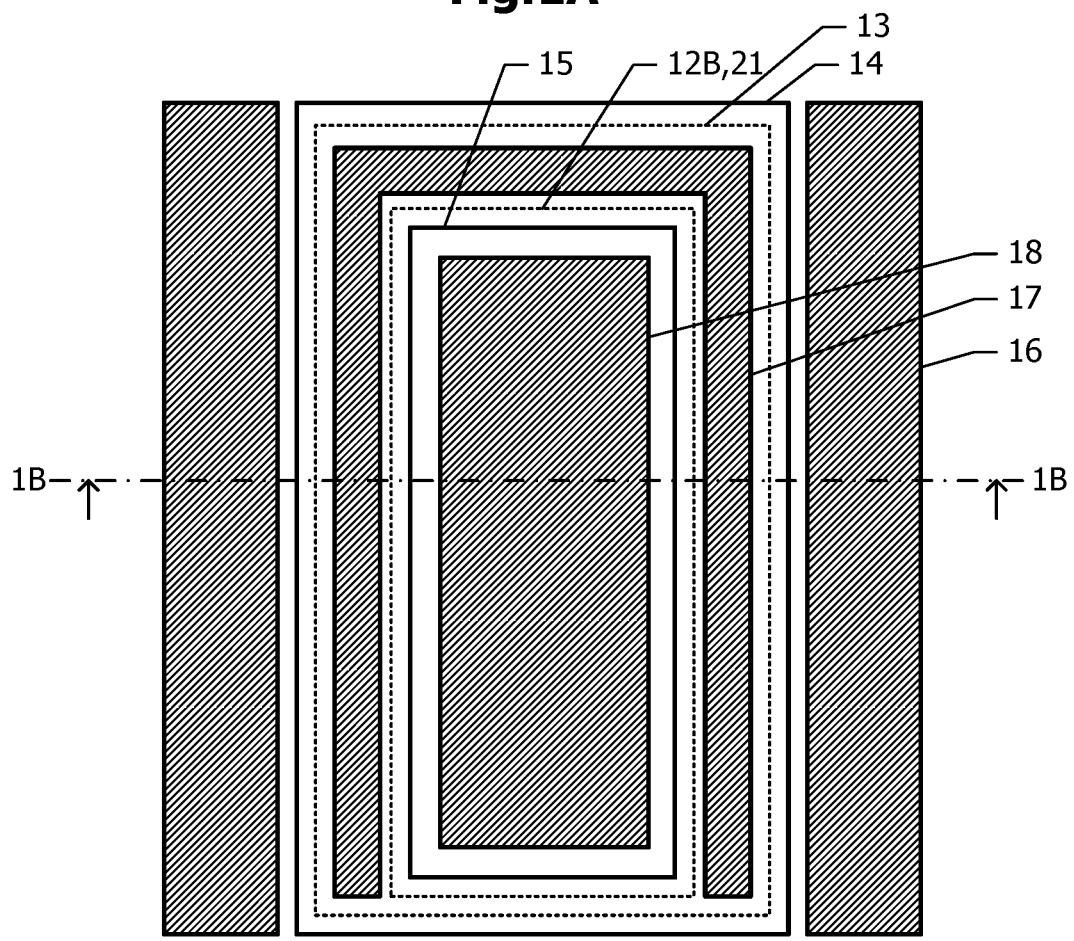
FIG. 1A is a plan view of a semiconductor device according to a first embodiment.
Figure 1B:
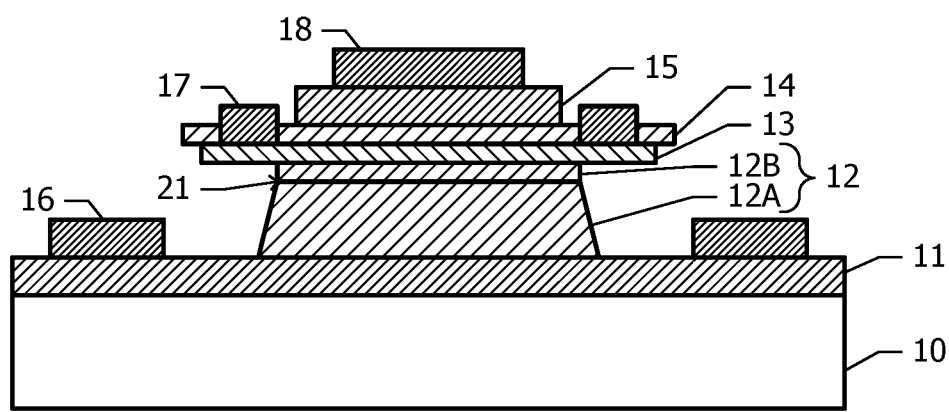
FIG. 1B is a sectional view taken along dash-dotted line 1B-1B in FIG. 1A.

Next, a semiconductor device according to a first embodiment will be described with reference to FIGS. 1A and 1B. FIG. 1A is a plan view of a semiconductor device according to the first embodiment, and FIG. 1B is a sectional view taken along dash-dotted line 1B-1B in FIG. 1A.

A sub-collector layer 11 made of an n-type semiconductor is epitaxially grown on a substrate 10 made of a semiconductor. A collector layer 12 made of an n-type semiconductor, a base layer 13 made of a p-type semiconductor, an emitter layer 14 made of an n-type semiconductor, and an emitter contact layer 15 made of an n-type semiconductor are sequentially epitaxially grown on the sub-collector layer 11. The collector layer 12 is disposed on a partial region of the sub-collector layer 11.

The collector layer 12 includes a first collector layer 12A on the substrate side and a second collector layer 12B on the first collector layer 12A. The composition of the first collector layer 12A and the composition of the second collector layer 12B are different from each other. Etching characteristics of the second collector layer 12B differ from etching characteristics of the first collector layer 12A and the base layer 13. For example, the second collector layer 12B is formed of a compound semiconductor containing phosphorus (P) as a group V element, and the first collector layer 12A and the base layer 13 are formed of a compound semiconductor that does not contain P as a group V element. In one example, the first collector layer 12A and the base layer 13 are formed of GaAs, and the second collector layer 12B is formed of InGaP.

The shape of each of the side faces of the first collector layer 12A is determined by the etching conditions and the etching time. When the first collector layer 12A is subjected to anisotropic etching in which the etching rate varies depending on the crystal plane orientation, any one of a forward inclined surface having an angle of inclination of less than 90°, a reversely inclined surface having an angle of inclination of more than 90°, and a perpendicular surface or a surface formed by a combination of these surfaces appears on the side face. Therefore, the edge of the lower surface of the first collector layer 12A and the edge of the upper surface of the first collector layer 12A do not necessarily coincide with each other in plan view. The shapes of the side faces of other semiconductor layers also depend on the etching conditions in a strict sense. However, in general, the thicknesses of the semiconductor layers other than the first collector layer 12A are sufficiently smaller than the thickness of the first collector layer 12A. Therefore, in the semiconductor layers other than the first collector layer 12A, the edge of the lower surface and the edge of the upper surface can be approximated to substantially coincide with each other.

In plan view, the edge (outer peripheral line) of an interface 21 between the first collector layer 12A and the second collector layer 12B is disposed inside the edge of the lower surface of the base layer 13. The edge of the upper surface of the second collector layer 12B is disposed inside the edge of the lower surface of the base layer 13. Herein, the term "upper surface" of each semiconductor layer can be defined as a surface of the semiconductor layer, the surface being substantially parallel to the upper surface of the substrate 10 and disposed on the side opposite to the substrate 10. Similarly, the term "lower surface" of each semiconductor layer can be defined as a surface of the semiconductor layer, the surface being substantially parallel to the upper surface of the substrate 10 and disposed on the substrate 10 side.

Furthermore, in plan view, the edge of the upper surface of the first collector layer 12A, the edge of the upper surface of the second collector layer 12B, and the edge of the lower surface of the second collector layer 12B are disposed inside the edge of the lower surface of the base layer 13. The edge of the upper surface of the base layer 13 is disposed inside the edge of the lower surface of the emitter layer 14.

A collector electrode 16 is disposed on the upper surface of the sub-collector layer 11 and in ohmic contact with the sub-collector layer 11. The sub-collector layer 11 functions as a current path through which a collector current flows between the collector electrode 16 and the first collector layer 12A. A base electrode 17 disposed on the emitter layer 14 is ohmically connected to the base layer 13 by an alloying treatment. An emitter electrode 18 is disposed on the emitter contact layer 15. The emitter electrode 18 is ohmically connected to the emitter layer 14 with the emitter contact layer 15 therebetween.

Next, advantageous effects obtained by adopting the configuration of the semiconductor device according to the first embodiment will be described.

One of indices showing the radio-frequency performance of an HBT is a maximum oscillation frequency ($f_{max}$). The maximum oscillation frequency $f_{max}$ is defined as a frequency at which the Mason' unilateral power gain is 1 (0 dB). A device having a larger maximum oscillation frequency $f_{max}$ is a device having better RF characteristics. The maximum oscillation frequency $f_{max}$ can be approximately represented by formula (1) below.

$$f_{max} = \sqrt{\frac{f_T}{8\pi R_B C_{BC}}} \tag{1}$$

In formula (1), $f_T$ represents a current-gain cutoff frequency, $R_B$ represents a base resistance, and $C_{BC}$ represents a base-collector capacitance. As is apparent from formula (1), a decrease in the base-collector capacitance $C_{BC}$ improves RF characteristics.

In the first embodiment, the interface 21 between the first collector layer 12A and the second collector layer 12B is smaller than the lower surface of the base layer 13 in plan view. Accordingly, the base-collector capacitance $C_{BC}$ in this embodiment is smaller than that of a structure in which a base layer and a collector layer have substantially the same size. Note that a region where a collector current flows at the base-collector interface (hereinafter referred to as an "operation region") is approximately limited to the inside of the emitter contact layer 15 in plan view. Even when the area of the horizontal section of the collector layer 12 is decreased, the operation region is not decreased as long as the collector layer 12 includes the emitter contact layer 15 inside thereof in plan view. The adoption of the configuration in which the collector layer 12 includes the emitter contact layer 15 inside of the collector layer 12 in plan view enables a decrease in the maximum output power to be suppressed even when the base-collector capacitance $C_{BC}$ is decreased.

At the interface between the base layer 13 made of GaAs and the second collector layer 12B made of InGaP, a potential barrier corresponding to the difference in electron affinity between GaAs and InGaP is generated. In order to transport an electron from the base layer 13 to the collector layer 12 through this potential barrier, it is preferable to reduce the thickness of the second collector layer 12B to the extent that the tunneling effect exhibits. For example, the thickness of the second collector layer 12B is preferably 20 nm or less, and more preferably 10 nm or less.

No overhanging portion formed of the second collector layer 12B alone is formed in the first embodiment. Therefore, a decrease in the yield due to insufficient mechanical strength can be suppressed compared with the structure in which the collector upper layer 102C (FIG. 8) projects to form an overhanging portion. In the first embodiment, although the base layer 13 and the emitter layer 14 project outward from the edge of the second collector layer 12B, the thickness of each of the two layers is sufficiently larger than the thickness that allows the tunneling effect to exhibit. Accordingly, this overhanging portion can maintain sufficient mechanical strength.

Next, a modification of the first embodiment will be described. In the first embodiment, the edge of the upper surface of the second collector layer 12B is disposed inside the edge of the lower surface of the base layer 13. Alternatively, the edge of the upper surface of the second collector layer 12B may coincide with the edge of the lower surface of the base layer 13. In this case, the edge of the interface between the first collector layer 12A and the second collector layer 12B (the upper surface of the first collector layer 12A) is also disposed inside the edge of the lower surface of the base layer 13 as in the case of the first embodiment.

Second Embodiment

Next, a semiconductor device according to a second embodiment will be described with reference to FIGS. 2 to 3J. Hereinafter, descriptions of configurations that are common to those of the semiconductor device according to the first embodiment (FIGS. 1A and 1B) will be omitted.

Figure 2:
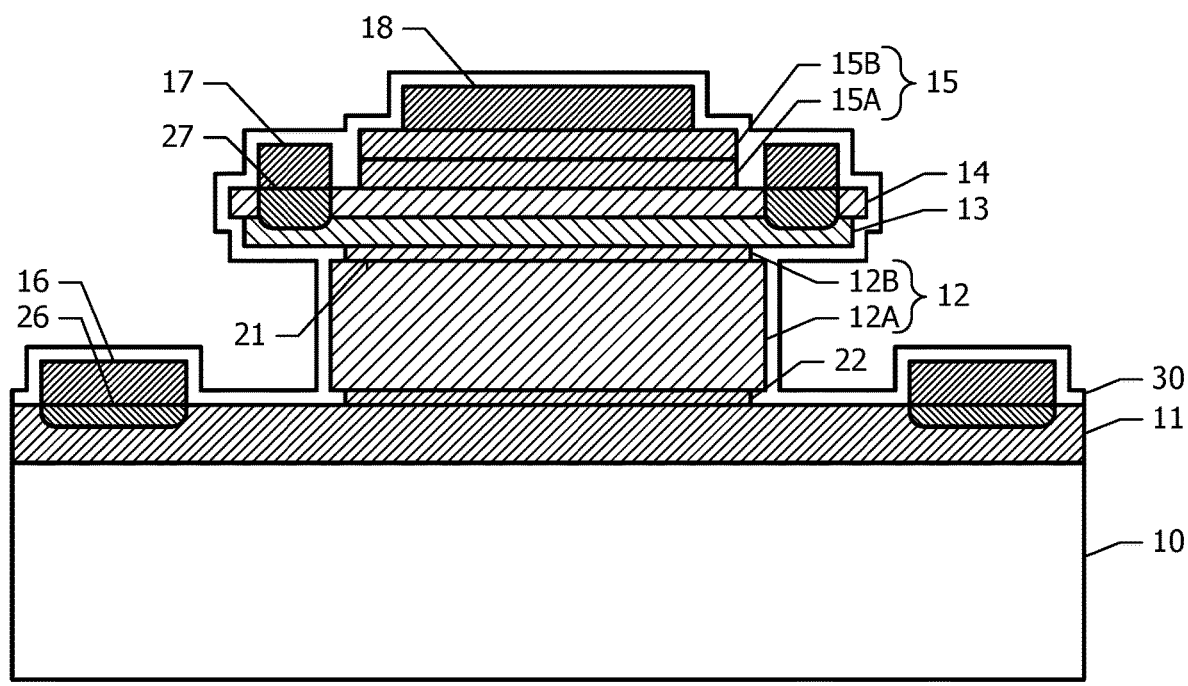
FIG. 2 is a sectional view of a semiconductor device according to a second embodiment.

FIG. 2 is a sectional view of a semiconductor device according to a second embodiment. In the second embodiment, an etching stopper layer 22 is disposed between a sub-collector layer 11 and a first collector layer 12A. The etching stopper layer 22 has etching characteristics different from those of the first collector layer 12A and the sub-collector layer 11. In plan view, the edge of the upper surface of the etching stopper layer 22 is disposed inside the edge of the lower surface of the first collector layer 12A.

The conductivity type of the etching stopper layer 22 is the same as the conductivity type of the sub-collector layer 11. The doping concentration of the etching stopper layer 22 is substantially equal to the doping concentration of the sub-collector layer 11. Accordingly, it can be considered that the etching stopper layer 22 functions, together with the sub-collector layer 11, as a current path through which a collector current flows in the operation of the HBT.

The edge of an interface 21 between the first collector layer 12A and a second collector layer 12B is disposed inside the edge of a base layer 13 as in the first embodiment. In the second embodiment, the side faces of the second collector layer 12B are disposed behind the side faces of the first collector layer 12A. For example, the edge of the lower surface of the second collector layer 12B is disposed inside the edge of the upper surface of the first collector layer 12A in plan view. Therefore, the interface 21 between the first collector layer 12A and the second collector layer 12B coincides with the lower surface of the second collector layer 12B. The edge of the upper surface of the second collector layer 12B is disposed inside the edge of the lower surface of the base layer 13 in plan view.

An emitter contact layer 15 includes two layers of a first emitter contact layer 15A on the lower side and a second emitter contact layer 15B disposed thereon. In plan view, the edge of the junction interface between the second collector layer 12B and the base layer 13 coincides with the edge of the lower surface of the emitter contact layer 15 or disposed outside the edge of the lower surface of the emitter contact layer 15. Therefore, the area of the substantial operation region is not decreased.

An alloyed region 26 is formed under a collector electrode 16. The collector electrode 16 is ohmically connected to the sub-collector layer 11 with the alloyed region 26 therebetween. An alloyed region 27 that extends through an emitter layer 14 and reaches the base layer 13 is formed under a base electrode 17. The base electrode 17 is ohmically connected to the base layer 13 with the alloyed region 27 therebetween. In plan view, the emitter layer 14 located between the base electrode 17 and the emitter contact layer 15 is depleted.

The collector layer 12, the base layer 13, the emitter layer 14, and the emitter contact layer 15 constitute an HBT. The HBT, the collector electrode 16, the base electrode 17, and an emitter electrode 18 are covered with an insulating film 30. For example, a planarizing insulating film, a metal wiring line for supplying electricity to the HBT, and passive elements such as a resistor, a capacitor, and an inductor may be provided on the insulating film 30.

Next, examples of the materials and dimensions of components of the semiconductor device according to the second embodiment will be described.

A substrate 10 is formed of semi-insulating GaAs and has a thickness of 200 μm. The sub-collector layer 11 is formed of n-type GaAs having a Si-doping concentration $5\times10^{18}$ cm$^{-3}$ and has a thickness of 600 nm. The sub-collector layer 11 may be formed of a compound semiconductor material containing GaAs as a main component.

The etching stopper layer 22 is formed of n-type InGaP having a Si-doping concentration of $5\times10^{18}$ cm$^{-3}$ and has a thickness of 10 nm. The mixed-crystal ratio of InP to GaP in the etching stopper layer 22 is 0.48:0.52, and the etching stopper layer 22 is lattice-matched to the substrate 10 made of GaAs. The etching stopper layer 22 may be formed of a compound semiconductor material containing InGaP as a main component.

The first collector layer 12A is formed of n-type GaAs doped with Si and has a thickness of 1,000 nm. The semiconductor material of the first collector layer 12A may be AlGaAs besides GaAs. Alternatively, the first collector layer 12A may be formed of a compound semiconductor material containing GaAs or AlGaAs as a main component. The second collector layer 12B is formed of n-type InGaP doped with Si and has a thickness of 10 nm. The second collector layer 12B may be formed of a compound semiconductor material containing InGaP as a main component. The first collector layer 12A and the second collector layer 12B each have a Si-doping concentration of $1\times10^{16}$ cm$^{-3}$. The mixed-crystal ratio of InP to GaP in the second collector layer 12B is the same as the mixed-crystal ratio of InP to GaP in the etching stopper layer 22.

The base layer 13 is formed of p-type GaAs having a C-doping concentration of $2.5\times10^{19}$ cm$^{-3}$ and has a thickness of 110 nm. The semiconductor material of the base layer 13 may be AlGaAs, InGaAs, GaAsSb, GaAsBi, GaInNAs, or the like besides GaAs. Alternatively, the base layer 13 may be formed of a semiconductor material containing, as a main component, one compound semiconductor selected from the group consisting of GaAs, AlGaAs, InGaAs, GaAsSb, GaAsBi, and GaInNAs.

The emitter layer 14 is formed of n-type InGaP having a Si-doping concentration of $3\times10^{17}$ cm$^{-3}$ and has a thickness of 40 nm. The mixed-crystal ratio of InP to GaP in the emitter layer 14 is the same as the mixed-crystal ratio of InP to GaP in the etching stopper layer 22. The emitter layer 14 may be formed of a compound semiconductor material containing InGaP as a main component.

The first emitter contact layer 15A is formed of n-type GaAs having a Si-doping concentration of $5\times10^{18}$ cm$^{-3}$ and has a thickness of 50 nm. The second emitter contact layer 15B is formed of n-type InGaAs having a Si-doping concentration of $1\times10^{19}$ cm$^{-3}$ and has a thickness of 50 nm. The mixed-crystal ratio of InAs to GaAs in the second emitter contact layer 15B is 0.5:0.5.

The collector electrode 16 is formed by stacking a AuGe film having a thickness of 60 nm, a Ni film having a thickness of 10 nm, and a Au film having a thickness of 200 nm. The AuGe film serving as a bottom layer reacts with the sub-collector layer 11 to form the alloyed region 26. The base electrode 17 is formed by stacking a Pt film having a thickness of 20 nm, a Ti film having a thickness of 50 nm, a Pt film having a thickness of 50 nm, and a Au film having a thickness of 200 nm. The Pt film serving as a bottom layer reacts with the emitter layer 14 and the base layer 13 to form the alloyed region 27.

The emitter electrode 18 is formed by stacking a Mo film having a thickness of 10 nm, a Ti film having a thickness of 5 nm, a Pt film having a thickness of 30 nm, and a Au film having a thickness of 200 nm. The Mo layer serving as a bottom layer contacts the second emitter contact layer 15B and is ohmically connected to the emitter layer 14 with the second emitter contact layer 15B and the first emitter contact layer 15A therebetween.

The insulating film 30 is formed of SiN and has a thickness of 200 nm.

Next, a method for producing a semiconductor device according to the second embodiment will be described with reference to FIGS. 3A to 3J. FIGS. 3A to 3J are sectional views of a semiconductor device according to the second embodiment during its production.

Figure 3A:
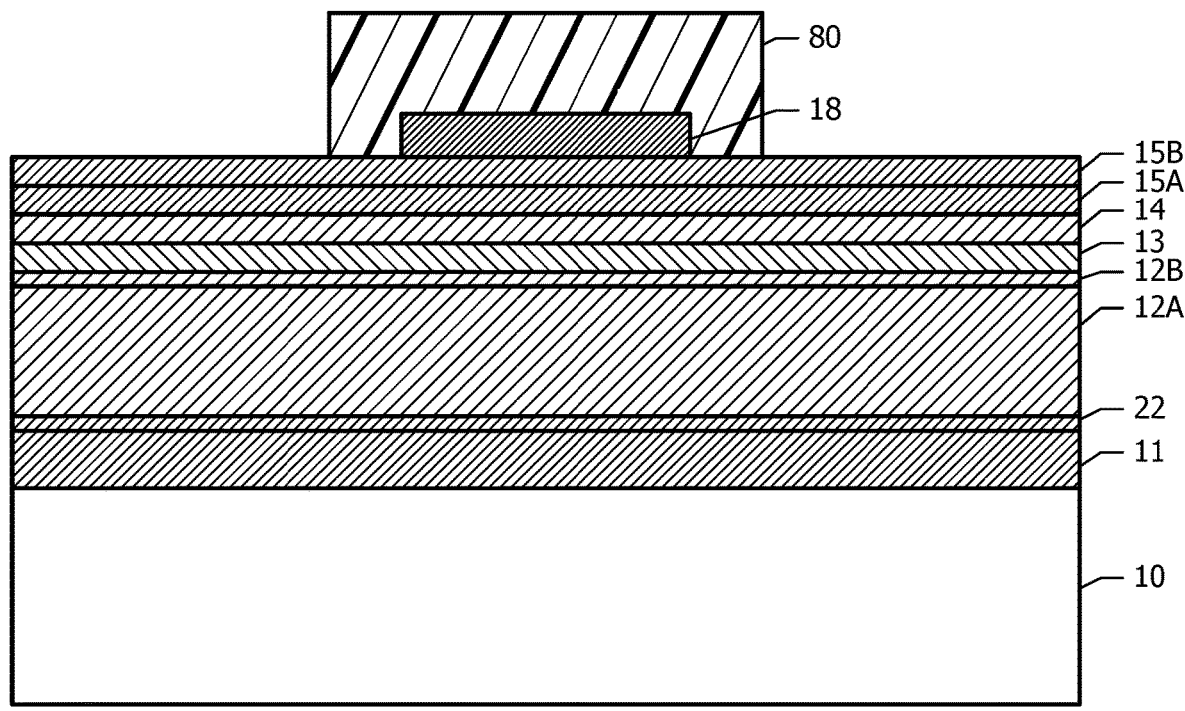
FIGS. 3A and 3B are sectional views of a semiconductor device according to the second embodiment during its production.

As illustrated in FIG. 3A, semiconductor layers including a sub-collector layer 11 to a second emitter contact layer 15B are sequentially epitaxially grown on a substrate 10 made of semi-insulating GaAs. These semiconductor layers can be formed by, for example, a metalorganic vapor-phase epitaxy method. An emitter electrode 18 is formed on the resulting emitter contact layer 15. The emitter electrode 18 can be formed by, for example, a vacuum evaporation method and a lift-off method. After the formation of the emitter electrode 18, a region where the emitter contact layer 15 is to be left (FIG. 2) is masked with a photoresist film 80.

Figure 3B:
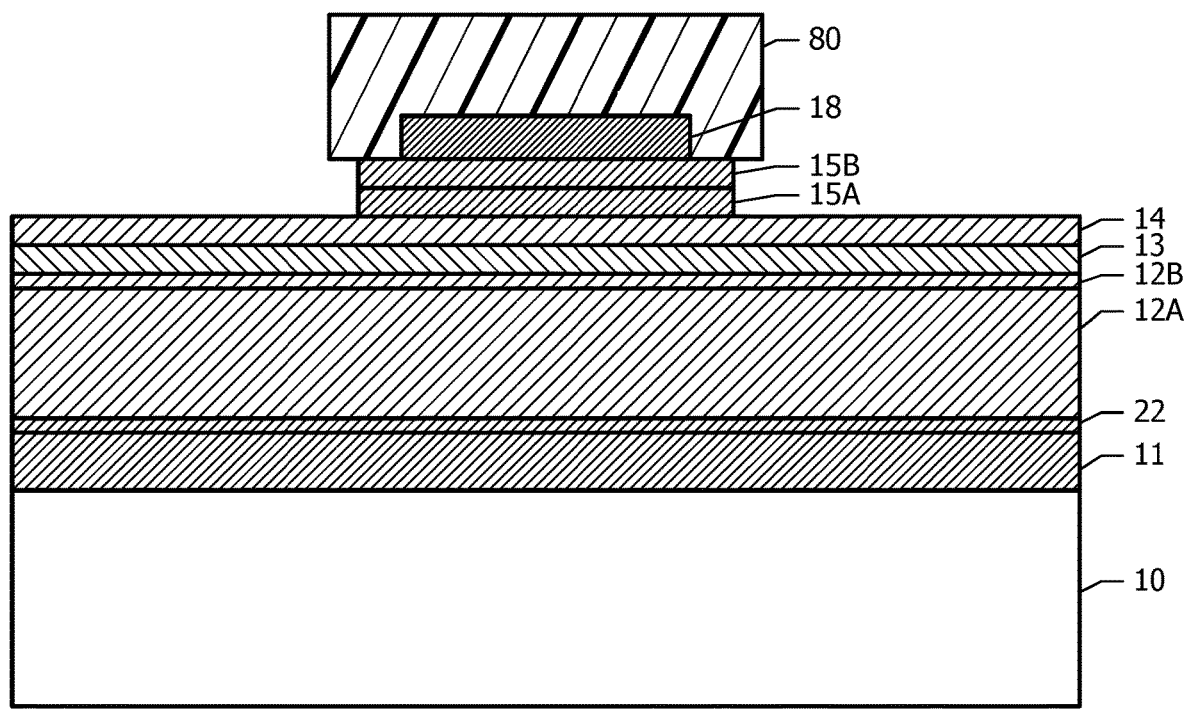

As illustrated in FIG. 3B, unnecessary portions of the second emitter contact layer 15B and the first emitter contact layer 15A are removed by etching using the photoresist film 80 as an etching mask. For example, wet etching is applied to the etching of the first emitter contact layer 15A and the second emitter contact layer 15B. An example of the etchant that can be used is a solution prepared by mixing phosphoric acid having a concentration of 85% by weight, a hydrogen peroxide solution having a concentration of 35% by weight, and water in a volume ratio of 1:2:40. This etchant has such selectivity that the second emitter contact layer 15B made of InGaAs and the first emitter contact layer 15A made of GaAs are selectively etched with respect to the emitter layer 14 made of InGaP. Herein, this etchant is referred to as an "etchant containing phosphoric acid as a main component".

The first emitter contact layer 15A and the second emitter contact layer 15B are subjected to side etching, and side faces of the first emitter contact layer 15A and the second emitter contact layer 15B are thereby disposed behind side faces of the photoresist film 80. After the unnecessary portions of the first emitter contact layer 15A and the second emitter contact layer 15B are etched, the photoresist film 80 is removed.

As illustrated in FIG. 3C, a base electrode 17 is formed on the emitter layer 14. The base electrode 17 can be formed by, for example, a vacuum evaporation method and a lift-off method. After the formation of the base electrode 17, a region where the emitter layer 14 is to be left (FIG. 2) is masked with a photoresist film 81.

As illustrated in FIG. 3D, an unnecessary portion of the emitter layer 14 is removed by etching using the photoresist film 81 as an etching mask. For example, hydrochloric acid can be used as the etchant for etching the emitter layer 14. This etchant has such selectivity that the emitter layer 14 made of InGaP is selectively etched with respect to the base layer 13 made of GaAs. The emitter layer 14 is subjected to side etching, and side faces of the emitter layer 14 are thereby disposed behind side faces of the photoresist film 81.

As illustrated in FIG. 3E, the etchant is changed from hydrochloric acid to the etchant containing phosphoric acid as a main component, and an unnecessary portion of the base layer 13 is removed by etching using the photoresist film 81 and the emitter layer 14 as an etching mask. The base layer 13 made of GaAs is selectively etched with respect to the emitter layer 14 and the second collector layer 12B that are made of InGaP. The base layer 13 is subjected to side etching, and side faces of the base layer 13 are thereby disposed behind the side faces of the emitter layer 14. As a result, the edge of the upper surface of the base layer 13 is disposed inside the edge of the lower surface of the emitter layer 14 in plan view. After the unnecessary portion of the base layer 13 is removed, the photoresist film 81 is removed.

As illustrated in FIG. 3F, a region where the second collector layer 12B is to be left is masked with a photoresist film 82. An unnecessary portion of the second collector layer 12B is removed by etching using the photoresist film 82 as an etching mask. For example, hydrochloric acid can be used as the etchant for etching the unnecessary portion of the second collector layer 12B. This etchant has such selectivity that the second collector layer 12B made of InGaP is selectively etched with respect to the first collector layer 12A made of GaAs. The second collector layer 12B is subjected to side etching, and side faces of the second collector layer 12B are thereby disposed behind side faces of the photoresist film 82.

As illustrated in FIG. 3G, the etchant is changed from hydrochloric acid to the etchant containing phosphoric acid as a main component, and an unnecessary portion of the first collector layer 12A is removed by etching using the photoresist film 82 and the second collector layer 12B as an etching mask. This etchant selectively etches the first collector layer 12A made of GaAs with respect to the second collector layer 12B and the etching stopper layer 22 that are made of InGaP.

The first collector layer 12A is subjected to side etching, and side faces of the first collector layer 12A are thereby disposed behind the side faces of the second collector layer 12B. Since the first collector layer 12A has a larger thickness than other semiconductor layers, the amount of side etching of the first collector layer 12A is larger than the amounts of side etching of the other semiconductor layers.

Note that etching with the etchant containing phosphoric acid as a main component has anisotropy in which the etching rate varies depending on the crystal plane orientation. Therefore, each of the side faces of the first collector layer 12A has a shape reflecting anisotropy of the etching rate, and the shape depends on the crystal plane orientation of the side face. As a result, the side face of the first collector layer 12A is constituted by, for example, a forward inclined surface, a reversely inclined surface, a perpendicular surface, or a complex surface formed by a combination of these surfaces.

As illustrated in FIG. 3H, the etchant is changed from the etchant containing phosphoric acid as a main component to hydrochloric acid, and exposed portions of the second collector layer 12B and the etching stopper layer 22 are removed by etching using the photoresist film 82 and the first collector layer 12A as an etching mask. In this etching, the second collector layer 12B and the etching stopper layer 22 that are made of InGaP are selectively etched with respect to the first collector layer 12A and the sub-collector layer 11 that are made of GaAs.

The second collector layer 12B and the etching stopper layer 22 are subjected to side etching, and side faces of the second collector layer 12B and the etching stopper layer 22 are thereby disposed behind the side faces of the first collector layer 12A. Even when each of the side faces of the first collector layer 12A is not a perpendicular surface, the edge of the lower surface of the second collector layer 12B is disposed inside the edge of the upper surface of the first collector layer 12A in plan view. Furthermore, the edge of the upper surface of the etching stopper layer 22 is disposed inside the edge of the lower surface of the first collector layer 12A in plan view.

After the unnecessary portions of the second collector layer 12B and the etching stopper layer 22 are removed, the photoresist film 82 is removed.

Figure 3I:
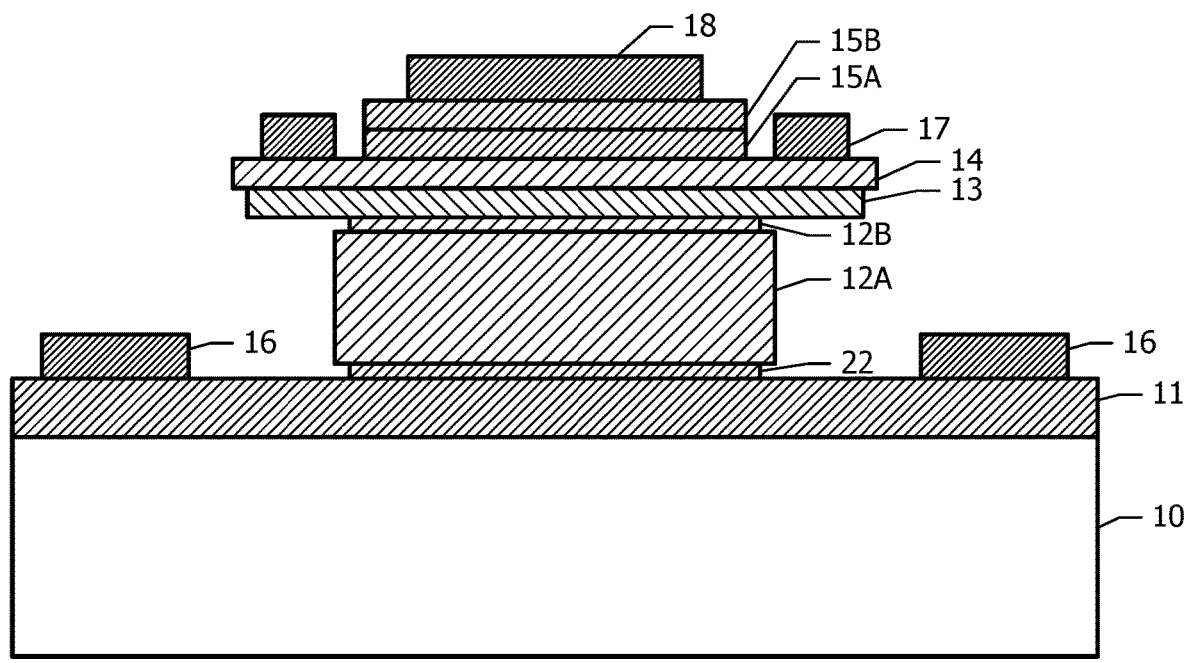
FIGS. 3I and 3J are sectional views of a semiconductor device according to the second embodiment during its production.

As illustrated in FIG. 3I, a collector electrode 16 is formed on the sub-collector layer 11. The collector electrode 16 can be formed by, for example, a vacuum evaporation method and a lift-off method.

Figure 3J:
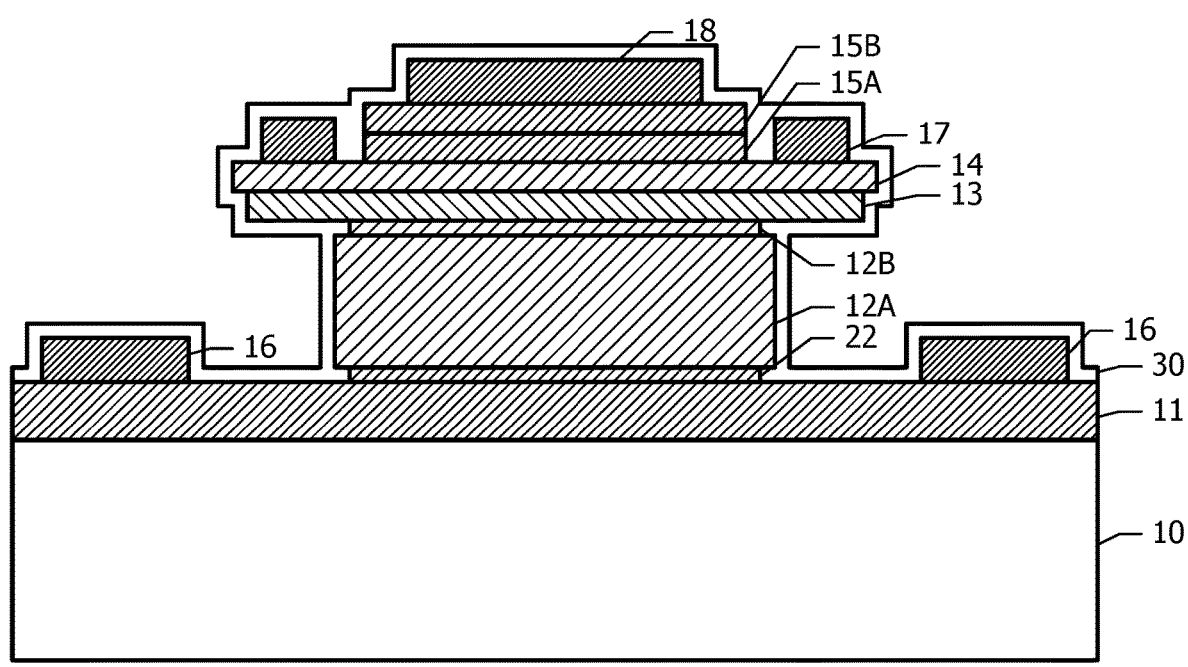

As illustrated in FIG. 3J, an insulating film 30 made of SiN is deposited over the entire exposed region. The insulating film 30 can be formed by, for example, chemical vapor deposition (CVD). Subsequently, heat treatment is performed in a nitrogen atmosphere, for example, at a temperature of 350° C. for 30 minutes to thereby form alloyed regions 26 and 27 (FIG. 2).

Next, advantageous effects obtained by adopting the configuration of the semiconductor device according to the second embodiment will be described.

In the second embodiment, the second collector layer 12B (FIG. 2), which is so thin that the tunneling effect exhibits, does not form an overhanging projection as in the first embodiment. Therefore, a decrease in the production yield can be suppressed. In addition, since the edge of the interface 21 (FIG. 2) between the first collector layer 12A and the second collector layer 12B is disposed inside the edge of the base layer 13 in plan view, the base-collector capacitance $C_{BC}$ can be decreased as in the first embodiment. Furthermore, in plan view, the operation region, which corresponds to the region occupied by the emitter contact layer 15, is not decreased even after the collector layer 12 is subjected to side etching. Therefore, the maximum output power does not decrease.

In the step of removing the unnecessary portion of the first collector layer 12A by etching (FIG. 3G), the etching is stopped by the etching stopper layer 22 with regard to the depth direction. Accordingly, the amount of side etching of the first collector layer 12A can be controlled independently of the thickness of the first collector layer 12A.

Next, a semiconductor device according to a modification of the second embodiment will be described. In the second embodiment, the doping concentration of the etching stopper layer 22 (FIG. 2) is substantially equal to the doping concentration of the sub-collector layer 11. In this modification, the doping concentration of the etching stopper layer 22 is substantially equal to the doping concentration of the first collector layer 12A. For example, each of the doping concentrations of the first collector layer 12A and the etching stopper layer 22 is $1\times10^{16}$ cm$^{-3}$. In this case, it can be considered that the etching stopper layer 22 is a part of the collector layer 12 (FIG. 2) in the operation of the HBT.

Third Embodiment

Next, a semiconductor device according to a third embodiment will be described with reference to FIGS. 4A and 4B. Hereinafter, descriptions of configurations that are common to those of the semiconductor device according to the second embodiment (FIG. 2) will be omitted.

In the second embodiment, InGaP is used for the second collector layer 12B (FIG. 2). In the third embodiment, InGaPN is used for the second collector layer 12B. The molar ratio of In to Ga is 0.528:0.472, and the molar ratio of P to N is 0.995:0.005. In this case, the electron affinity of the second collector layer 12B is substantially equal to the electron affinity of the base layer 13 made of GaAs. In the third embodiment, the doping concentration of the second collector layer 12B is equal to the doping concentration of the second collector layer 12B of the semiconductor device according to the second embodiment.

Figure 4A:
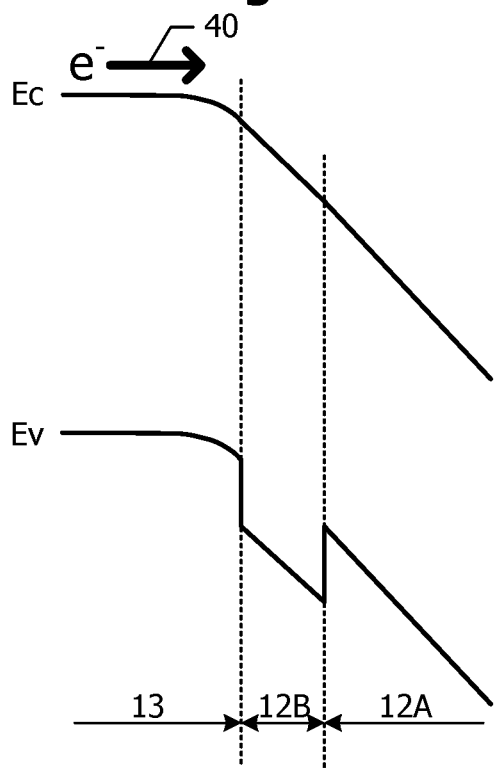
FIGS. 4A and 4B are energy band diagrams of a base layer, a second collector layer, and a first collector layer of semiconductor devices according to a third embodiment and the second embodiment, respectively.
Figure 4B:
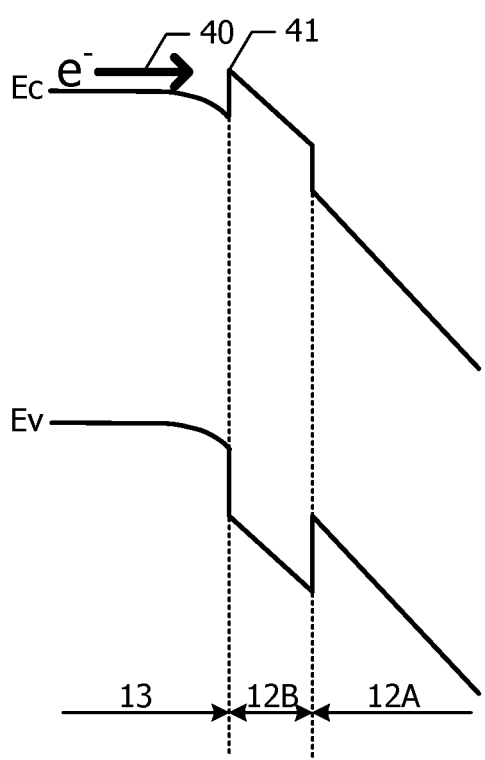

FIGS. 4A and 4B are energy band diagrams of the base layer 13, the second collector layer 12B, and the first collector layer 12A of the semiconductor devices according to the third embodiment and the second embodiment (FIG. 2), respectively. The energy band diagrams of FIGS. 4A and 4B show the potential energy for an electron. The energy Ec of the lower edge of the conduction band and the energy Ev of the upper edge of the valence band are shown by the solid lines.

Electrons injected from the emitter layer 14 (FIG. 2) into the base layer 13 diffuse in the directions shown by arrows 40 in FIGS. 4A and 4B and reach the interface between the base layer 13 and the second collector layer 12B. The electrons reaching the interface receive the action from the electric field in the second collector layer 12B and the first collector layer 12A and drift.

In the case of the second embodiment, a potential barrier 41 (FIG. 4B) of about 200 meV for an electron is generated at the interface between the base layer 13 and the second collector layer 12B. The electron passes through this potential barrier due to the tunneling effect. In contrast, no potential barrier is generated in the third embodiment.

Next, advantageous effects obtained by adopting the configuration of the semiconductor device according to the third embodiment will be described. In the third embodiment, since no potential barrier is generated at the interface between the base layer 13 and the second collector layer 12B, electrons in the base layer 13 can flow into the second collector layer 12B without being disturbed by a potential barrier.

The tunneling probability is less than 1. Therefore, in the case where conditions other than the difference in material of the second collector layer 12B are the same, the collector current of the semiconductor device according to the third embodiment is larger than the collector current of the semiconductor device according to the second embodiment. That is, the semiconductor device according to the third embodiment has a higher current drive capability than the semiconductor device according to the second embodiment.

Similarly, at the interface between the first collector layer 12A (FIG. 2) and the etching stopper layer 22 (FIG. 2), a potential barrier of about 200 meV is generated at the lower edge of the conduction band. Most of the electrons in the conduction band at this interface have higher energy than the energy at the upper edge of the potential barrier. Therefore, the potential barrier generated at the interface between the first collector layer 12A and the etching stopper layer 22 does not significantly disturb the transfer of the electrons.

Next, a semiconductor device according to a modification of the third embodiment will be described. In the third embodiment, InGaPN is used for the second collector layer 12B (FIG. 2). In the modification, in addition to the second collector layer 12B, the etching stopper layer 22 is also made of InGaPN. The molar ratio of the constituent elements of the etching stopper layer 22 is the same as the molar ratio of the constituent elements of the second collector layer 12B.

The doping concentration of the etching stopper layer 22 may be substantially equal to the doping concentration of the first collector layer 12A or substantially equal to the doping concentration of the sub-collector layer 11. This achieves the effect that no potential barrier is generated at the interface between the first collector layer 12A and the etching stopper layer 22.

Fourth Embodiment

Next, a semiconductor device according to a fourth embodiment will be described with reference to FIGS. 5 to 6D. Hereinafter, descriptions of configurations that are common to those of the semiconductor device according to the second embodiment (FIG. 2) will be omitted.

Figure 5:
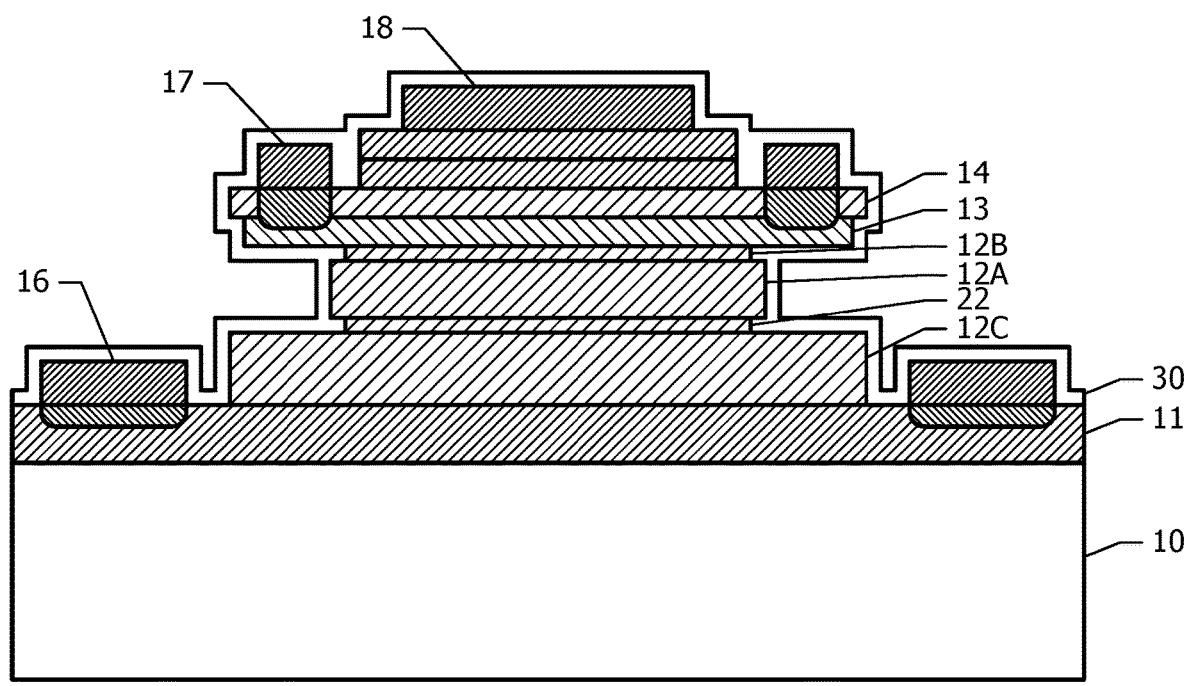
FIG. 5 is a sectional view of a semiconductor device according to a fourth embodiment.

FIG. 5 is a sectional view of a semiconductor device according to the fourth embodiment. Components of the semiconductor device illustrated in FIG. 5 are assigned the same reference signs as those assigned to the corresponding components of the semiconductor device according to the second embodiment illustrated in FIG. 2.

In the second embodiment, the etching stopper layer 22 (FIG. 2) is in contact with the sub-collector layer 11. In the fourth embodiment, a third collector layer 12C is disposed between an etching stopper layer 22 and a sub-collector layer 11. The doping concentration of the etching stopper layer 22 is equal to the doping concentration of a first collector layer 12A. The third collector layer 12C is formed of the same compound semiconductor as the first collector layer 12A, and the doping concentration of the third collector layer 12C is equal to the doping concentration of the first collector layer 12A.

The total of the thickness of the first collector layer 12A and the thickness of the third collector layer 12C is equal to the thickness of the first collector layer 12A (FIG. 2) according to the second embodiment. For example, the thickness of the first collector layer 12A and the thickness of the third collector layer 12C are each 500 nm. In plan view, the edge of the upper surface of the third collector layer 12C is disposed outside the edge of the lower surface of an emitter layer 14.

Next, a method for producing a semiconductor device according to the fourth embodiment will be described with reference to FIGS. 6A to 6D. FIGS. 6A to 6D are sectional views of a semiconductor device according to the fourth embodiment during its production. In the epitaxial growth step in the second embodiment illustrated in FIG. 3A, a third collector layer 12C (FIG. 5) is grown on a sub-collector layer 11, and semiconductor layers including an etching stopper layer 22 to a second emitter contact layer 15B are grown on the third collector layer 12C.

FIG. 6A corresponds to FIG. 3G of the second embodiment. An unnecessary portion of the first collector layer 12A is etched with the etchant containing phosphoric acid as a main component using a photoresist film 82 and a second collector layer 12B as an etching mask. The first collector layer 12A is subjected to side etching. With regard to the depth direction, the etching is stopped by the etching stopper layer 22.

As illustrated in FIG. 6B, exposed portions of the second collector layer 12B and the etching stopper layer 22 are removed by etching with hydrochloric acid using the photoresist film 82 and the first collector layer 12A as an etching mask. The second collector layer 12B and the etching stopper layer 22 are subjected to side etching as in the etching step illustrated in FIG. 3H of the second embodiment.

As illustrated in FIG. 6C, a region where the third collector layer 12C is to be left is masked with a photoresist film 83, and an unnecessary portion of the third collector layer 12C is removed by etching. In this step, the time is controlled so that the etching is stopped on the upper surface of the sub-collector layer 11. Preferably, the third collector layer 12C is slightly over-etched in order to expose the sub-collector layer 11. After the etching of the unnecessary portion of the third collector layer 12C, the photoresist film 83 is removed.

As illustrated in FIG. 6D, a collector electrode 16 is formed on the sub-collector layer 11. The subsequent steps are common to the step illustrated in FIG. 3J of the second embodiment and the steps thereafter.

Next, advantageous effects obtained by adopting the configuration of the semiconductor device according to the fourth embodiment will be described. Advantageous effects similar to those of the second embodiment are obtained in the fourth embodiment. Furthermore, the thickness of the first collector layer 12A of the semiconductor device according to the fourth embodiment is smaller than the thickness of the first collector layer 12A (FIG. 2) of the semiconductor device according to the second embodiment. Therefore, in the step of subjecting the first collector layer 12A to side etching (FIG. 6A), controllability of the amount of side etching is enhanced.

The third collector layer 12C extends outside the edge of the first collector layer 12A. This structure provides the advantageous effect that heat generated at the base-collector interface is easily transferred to a substrate 10. By using the substrate 10 as a heat sink, an increase in the temperature of the HBT can be suppressed.

Fifth Embodiment

Next, a semiconductor device according to a fifth embodiment will be described with reference to FIG. 7. Hereinafter, descriptions of configurations that are common to those of the semiconductor device according to the second embodiment (FIG. 2) will be omitted.

Figure 7:
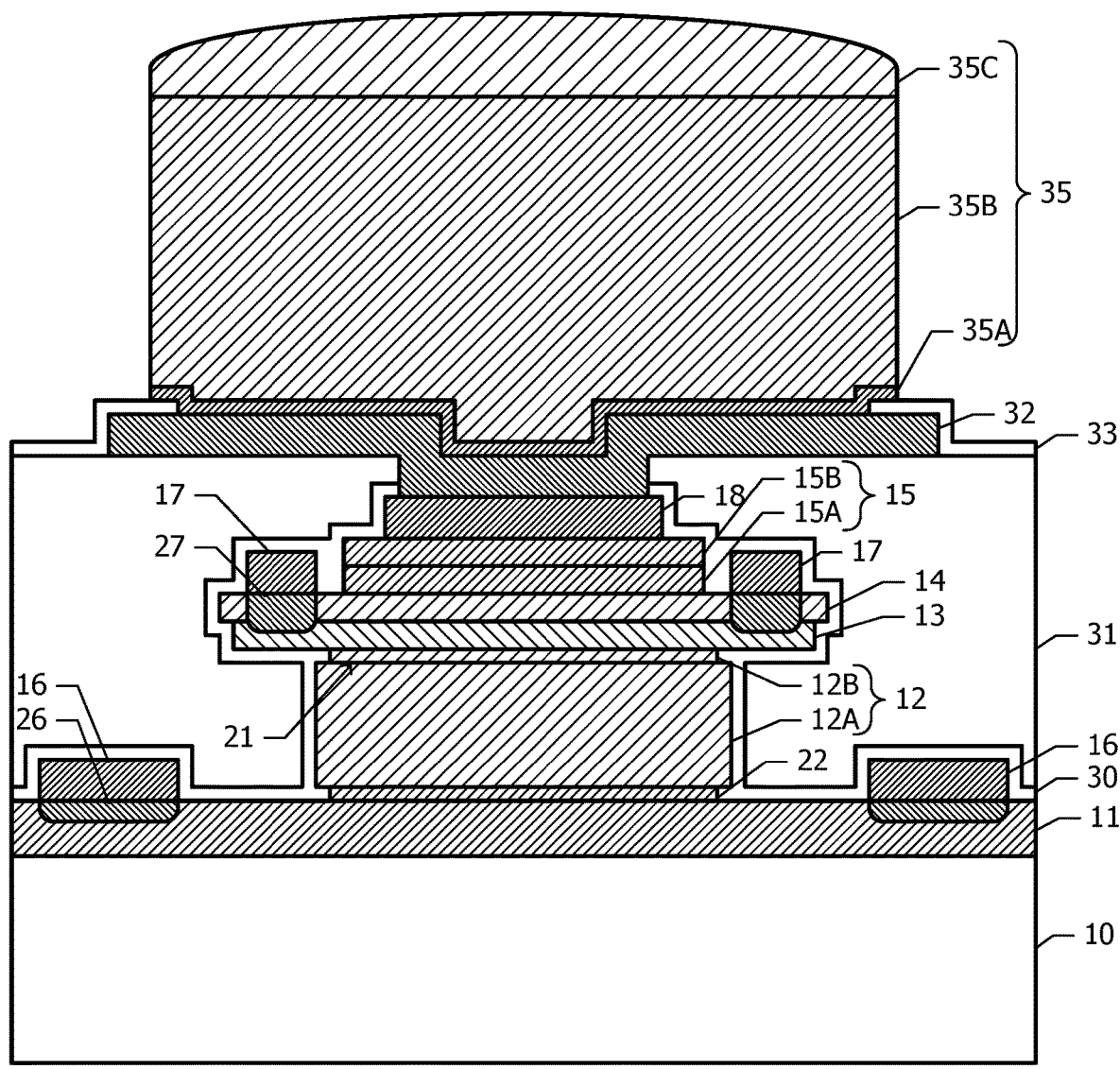
FIG. 7 is a sectional view of a semiconductor device according to a fifth embodiment.

FIG. 7 is a sectional view of a semiconductor device according to the fifth embodiment. A planarizing insulating film 31 is disposed on an insulating film 30. For example, a resin such as polyimide can be used as the planarizing insulating film 31. The planarizing insulating film 31 has a thickness of about 3 μm, and an upper surface thereof is planarized.

An emitter wiring line 32 is disposed on the planarizing insulating film 31. The emitter wiring line 32 is connected to an emitter electrode 18 in terms of a direct current through an opening provided in the insulating film 30 and the planarizing insulating film 31. For example, a Au film having a thickness of 2 μm can be used as the emitter wiring line 32. A passivation film 33 is disposed on the planarizing insulating film 31 so as to cover the emitter wiring line 32. For example, a SiN film having a thickness of 400 nm can be used as the passivation film 33. An opening is provided in the passivation film 33, and the emitter wiring line 32 is exposed at a bottom surface of the opening.

A bump 35 is disposed on the emitter wiring line 32 exposed in the opening of the passivation film 33. The bump 35 has a layered structure in which an underlying film 35A, a Cu pillar 35B, and a solder layer 35C are stacked. The underlying film 35A includes, for example, a Ti film having a thickness of 100 nm and a Cu film having a thickness of 100 nm and disposed on the Ti film. The underlying film 35A is used as a seed electrode for plating. The Cu pillar 35B has a thickness of, for example, 50 µm. For example, Ag—Sn solder is used for the solder layer 35C.

A collector bump that is electrically connected to a collector electrode 16 and a base bump that is electrically connected to a base electrode 17 are disposed in a region other than the region illustrated in the section of FIG. 7. The semiconductor device according to the fifth embodiment can be face-down mounted on a mounting substrate with the bump 35 therebetween.

The embodiments described above are exemplary, and, needless to say, a partial replacement or combination of configurations described in different embodiments is possible. The same or similar advantageous effects achieved by the same or similar configurations in a plurality of embodiments will not be mentioned in each of the embodiments. Furthermore, the present disclosure is not limited to the embodiments described above. For example, it is obvious for those skilled in the art that various modifications, improvements, combinations, and the like can be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor device comprising:
    a bipolar transistor including a first collector layer, a second collector layer, a base layer, and an emitter layer that are stacked on a substrate, wherein
    a composition of the first collector layer and a composition of the second collector layer are different from each other, and
    in plan view, an edge of an interface between the first collector layer and the second collector layer is disposed inside an edge of a lower surface of the base layer, and
    an edge of an upper surface of the second collector layer coincides with the edge of the lower surface of the base layer or is disposed inside the edge of the lower surface of the base layer, and
    an edge of a lower surface of the second collector layer is disposed inside an edge of an upper surface of the first collector layer.

2. The semiconductor device according to claim 1, wherein the second collector layer has a composition containing phosphorus.

3. The semiconductor device according to claim 1, wherein
    in plan view, an edge of an upper surface of the first collector layer, the edge of the upper surface of the second collector layer, and an edge of a lower surface of the second collector layer are disposed inside the edge of the lower surface of the base layer.

4. The semiconductor device according to claim 1, wherein in plan view, an edge of an upper surface of the base layer is disposed inside an edge of a lower surface of the emitter layer.

5. The semiconductor device according to claim 1, further comprising:
    a sub-collector layer disposed between the substrate and the first collector layer and functioning as a current path through which a collector current flows into the first collector layer; and
    an etching stopper layer disposed between the sub-collector layer and the first collector layer and made of a semiconductor having the same etching characteristics as the second collector layer,
    wherein, in plan view, an edge of an upper surface of the etching stopper layer is disposed inside an edge of a lower surface of the first collector layer.

6. The semiconductor device according to claim 5, wherein
    the base layer contains one compound semiconductor selected from the group consisting of GaAs, AlGaAs, InGaAs, GaAsSb, GaAsBi, and GaInNAs as a main component, and
    the emitter layer contains InGaP as a main component.

7. The semiconductor device according to claim 6, wherein
    the first collector layer and the sub-collector layer contain GaAs as a main component, and
    the second collector layer and the etching stopper layer contain InGaP as a main component.

8. The semiconductor device according to claim 6, wherein
    the first collector layer and the sub-collector layer contain GaAs as a main component,
    the second collector layer contains InGaPN as a main component, and
    the etching stopper layer contains InGaP as a main component.

9. The semiconductor device according to claim 6, wherein
    the first collector layer and the sub-collector layer contain GaAs as a main component, and
    the second collector layer and the etching stopper layer contain InGaPN as a main component.

10. The semiconductor device according to claim 1, further comprising:
    a bump disposed at a position higher than the emitter layer as viewed from the substrate, and connected to the emitter layer in terms of a direct current.

11. The semiconductor device according to claim 5, further comprising:
    a third collector layer disposed between the sub-collector layer and the etching stopper layer and having the same etching characteristics as the first collector layer,
    wherein, in plan view, an edge of an upper surface of the third collector layer is disposed outside the edge of the lower surface of the first collector layer.

12. The semiconductor device according to claim 11, wherein
    the base layer contains one compound semiconductor selected from the group consisting of GaAs, AlGaAs, InGaAs, GaAsSb, GaAsBi, and GaInNAs as a main component,
    the emitter layer contains InGaP as a main component,
    the first collector layer, the third collector layer, and the sub-collector layer contain GaAs as a main component, and
    the second collector layer and the etching stopper layer contain InGaP as a main component.

13. The semiconductor device according to claim 11, wherein
    the base layer contains one compound semiconductor selected from the group consisting of GaAs, AlGaAs, InGaAs, GaAsSb, GaAsBi, and GaInNAs as a main component,
    the emitter layer contains InGaP as a main component,
    the first collector layer, the third collector layer, and the sub-collector layer contain GaAs as a main component, the second collector layer contains InGaPN as a main component, and the etching stopper layer contains InGaP as a main component.

14. The semiconductor device according to claim 11, wherein the base layer contains one compound semiconductor selected from the group consisting of GaAs, AlGaAs, InGaAs, GaAsSb, GaAsBi, and GaInNAs as a main component, the emitter layer contains InGaP as a main component, the first collector layer, the third collector layer, and the sub-collector layer contain GaAs as a main component, and the second collector layer and the etching stopper layer contain InGaPN as a main component.

15. The semiconductor device according to claim 11, further comprising:

a bump disposed at a position higher than the emitter layer as viewed from the substrate and connected to the emitter layer in terms of a direct current.

16. The semiconductor device according to claim 2, wherein in plan view, an edge of an upper surface of the first collector layer, the edge of the upper surface of the second collector layer, and an edge of a lower surface of the second collector layer are disposed inside the edge of the lower surface of the base layer.

17. The semiconductor device according to claim 2, wherein in plan view, an edge of an upper surface of the base layer is disposed inside an edge of a lower surface of the emitter layer.

18. The semiconductor device according to claim 2, further comprising:

a sub-collector layer disposed between the substrate and the first collector layer and functioning as a current path through which a collector current flows into the first collector layer; and an etching stopper layer disposed between the sub-collector layer and the first collector layer and made of a semiconductor having the same etching characteristics as the second collector layer, wherein, in plan view, an edge of an upper surface of the etching stopper layer is disposed inside an edge of a lower surface of the first collector layer.

19. The semiconductor device according to claim 2, further comprising:

a bump disposed at a position higher than the emitter layer as viewed from the substrate, and connected to the emitter layer in terms of a direct current.

20. The semiconductor device according to claim 12, further comprising:

a bump disposed at a position higher than the emitter layer as viewed from the substrate and connected to the emitter layer in terms of a direct current.

* * * * *